United States Patent
Li et al.

(10) Patent No.: US 9,484,489 B2
(45) Date of Patent: Nov. 1, 2016

(54) ENGINEERED BAND GAPS

(71) Applicant: Massachusetts Institute of Technology, Cambridge, MA (US)

(72) Inventors: Ju Li, Weston, MA (US); Xiaofeng Qian, Winchester, MA (US); Menghao Wu, Hubei (CN)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 14/818,035

(22) Filed: Aug. 4, 2015

(65) Prior Publication Data

US 2016/0043270 A1  Feb. 11, 2016

Related U.S. Application Data

(60) Provisional application No. 62/033,558, filed on Aug. 5, 2014.

(51) Int. Cl.
| | |
|---|---|
| *H01L 31/109* | (2006.01) |
| *H01L 33/04* | (2010.01) |
| *H01L 33/00* | (2010.01) |
| *H01L 31/072* | (2012.01) |
| H01L 29/04 | (2006.01) |

(52) U.S. Cl.
CPC ........... *H01L 33/002* (2013.01); *H01L 31/072* (2013.01); *H01L 31/109* (2013.01); *H01L 33/04* (2013.01); H01L 29/045 (2013.01); Y02E 10/50 (2013.01)

(58) Field of Classification Search
CPC ................................................... H01L 33/002
See application file for complete search history.

(56) References Cited

U.S. PATENT DOCUMENTS

| | | | |
|---|---|---|---|
| 5,981,400 A * | 11/1999 | Lo ........................... | C30B 25/18 117/97 |
| 6,037,603 A | 3/2000 | Nelson et al. | |
| 2003/0001238 A1* | 1/2003 | Ban ....................... | H01L 29/205 257/627 |
| 2006/0237709 A1* | 10/2006 | Lee ........................ | B82Y 20/00 257/11 |
| 2010/0237343 A1* | 9/2010 | Nakahara ................ | C23C 14/08 257/43 |

(Continued)

OTHER PUBLICATIONS

International Search Report and Written Opinion for Application No. PCT/US2015/043549 mailed Jan. 7, 2016.

(Continued)

*Primary Examiner* — Stephen W Smoot
(74) *Attorney, Agent, or Firm* — Wolf, Greenfield & Sacks, P.C.

(57) ABSTRACT

An optoelectronic device as well as its methods of use and manufacture are disclosed. In one embodiment, an optoelectronic device includes first and second semiconducting atomically thin layers with corresponding first and second lattice directions. The first and second semiconducting atomically thin layers are located proximate to each other, and an angular difference between the first lattice direction and the second lattice direction is between about 0.000001° and 0.5°, or about 0.000001° and 0.5° deviant from of a Vicnal angle of the first and second semiconducting atomically thin layers. Alternatively, or in addition to the above, the first and second semiconducting atomically thin layers may form a Moiré superlattice of exciton funnels with a period between about 50 nm to 3 cm. The optoelectronic device may also include charge carrier conductors in electrical communication with the semiconducting atomically thin layers to either inject or extract charge carriers.

26 Claims, 14 Drawing Sheets

(56) References Cited

U.S. PATENT DOCUMENTS

2012/0049161 A1* 3/2012 Dimitrakopoulos H01L 21/02378
257/29
2014/0017839 A1 1/2014 Ju et al.

OTHER PUBLICATIONS

Berashevich et al., On the Nature of Interlayer Interactions in a System of Two Graphene Fragments. The Journal of Physical Chemistry C. 2011. 115: 24666-73.
Blöchl et al., Projector augmented-wave method. Physical Review B. 1994. 50:17953-17979.
Brihuega et al., Unraveling the intrinsic and robust nature of van Hove singularities in twisted bilayer graphene. Physical Review Letters. Nov. 9, 2012. 109(19):26 pages.
Ci et al., Atomic layers of hybridized boron nitride and graphene domains. Nat Mater. 2010. 9: 430-5.
Dai et al., Bilayer Phosphorene: Effect of Stacking Order on Bandgap and Its Potential Applications in Thin-Film Solar Cells. The Journal of Physical Chemistry Letters. 2014. 5: 1289-93.
Dean et al. Hofstadter/'s butterfly and the fractal quantum Hall effect in moire superlattices. Nature. 2013. 497: 598-602.
Feng et al., Strain-engineered artificial atom as a broad-spectrum solar energy funnel. Nat Photon. 2012. 6: 866-72.
Fu et al., Tailoring Exciton Dynamics by Elastic Strain-Gradient in Semiconductors. Advanced Materials. 2014 26, 2572-2579 (2014).
Grimme, Semiempirical GGA-type density functional constructed with a long-range dispersion correction. Journal of Computational Chemistry. 2006. 27: 1787-1799.
Hedin, New Method for Calculating the One-Particle Green's Function with Application to the Electron-Gas Problem. Physical Review. 1965. 139: A796-A823.
Heyd et al., Hybrid functionals based on a screened Coulomb potential. The Journal of Chemical Physics. 2003. 118: 8207-15.
Hirshfeld, Bonded-atom fragments for describing molecular charge densities. Theoret. Chim. Acta. 1977. 44: 129-38.
Hunt et al. Massive Dirac Fermions and Hofstadter Butterfly in a van der Waals Heterostructure. Science. 2013. 340: 1427-30.
Hybertsen et al., First-Principles Theory of Quasiparticles: Calculation of Band Gaps in Semiconductors and Insulators. Physical Review Letters. Sep. 23, 1985. 55: 1418-21.
Kim et al. Raman Spectroscopy Study of Rotated Double-Layer Graphene: Misorientation-Angle Dependence of Electronic Structure. Physical Review Letters. Jun. 15, 2012. 108: 246103.
Kresse et al., Efficiency of ab-initio total energy calculations for metals and semiconductors using a plane-wave basis set. Computational Materials Science. 1996. 6: 15-50.
Kresse et al., Efficient iterative schemes for ab initio total-energy calculations using plane-wave basis set. Physical Review B. Oct. 15, 1996. 54: 11169-86.
Li et al., Black phosphorus field-effect transistors. Nature Nanotechnology. Mar. 2, 2014. 9: 372-7. DOI: 10.1038/NNANO.2014.35.
Li et al., Elastic strain engineering for unprecedented materials properties. MRS Bull. Feb. 2014. 39: 108-14. DOI: 10.1557/mrs.2014.3.
Liu et al., In-plane heterostructures of graphene and hexagonal boron nitride with controlled domain sizes. Nat Nanotechnol. Jan. 27, 2013. 8: 119-24. DOI: 10.1038/NNANO.2012.256.
Lopes Dos Santos et al., Graphene Bilayer with a Twist: Electronic Structure. Physical Review Letters. Dec. 21, 2007. 99: 256802.
Morell et al., Flat Bands in slightly twisted bilayer graphene.: Tight binding calculations. The American Physical Society. Physical Review B. 2010. 82: 121407(R). 4 pages.
Nam et al. Strain-Induced Pseudoheterostructure Nanowires Confining Carriers at Room Temperature with Nanoscale-Tunable Band Profiles. Nano Lett. Jun. 11, 2013. 13: 3118-23. dx.doi.org/10.1021/n1401042n.
Onida et al., Electronic excitations: density-functional versus many-body Green's-function approaches. Reviews of Modern Physics. Apr. 2002. 74: 601-59.
Ponomarenko et al. Cloning of Dirac fermions in graphene superlattices. Nature advance. May 30, 2013.497: 594-597. doi:10.1038/nature12187.
Qi et al., Slip corona surrounding bilayer graphene nanopore. Nanoscale. 2012. 4:5989-97. DOI: 10.1039/c2nr31405c.
Salpeter et al., A Relativistic Equation for Bound-State Problems. Physical Review. Dec. 15, 1951. 84(6): 1232-42.
Shevchenko et al., Structural diversity in binary nanoparticle superlattices. Nature. Jan. 5, 2006. 439: 55-9. doi:10.1038/nature04414.
Shockley et al., Detailed Balance Limit of Efficiency of p-n Junction Solar Cells. J. Appl. Phys. Mar. 1961. 32(3): 510-19. doi: 10.1063/1.1736034.
Suess et al. Analysis of enhanced light emission from highly strained germanium microbridges. Nat Photon. Apr. 14, 2013. 7:466-72. DOI: 10.1038/NPHOTON.2013.67.
Wu et al., Tunable Exciton Funnel Using Moiré Superlattice in Twisted van der Waals Bilayer. Nanoletters. American Chem Soc. 2014. 14: 5350-7.
Yan et al., Angle-Dependent van Hove singularities and their breakdown in twisted graphene bilayers. Physical Review B. Sep. 2, 2014. 90:115402. 16 pages.
Yankowitz et al. Emergence of superlattice Dirac points in graphene on hexagonal boron nitride. Nat Phys. Mar. 25, 2012. 8:382-6. DOI: 10.1038/NPHYS2272.
Ye et al. Competition of shape and interaction patchiness for self-assembling nanoplates. Nat Chem. May 12, 2013. 5: 466-73. DOI: 10.1038/NCHEM.1651.
Invitation to Pay Additional Fees for Application No. PCT/US2015/043549 mailed Oct. 16, 2015.

* cited by examiner

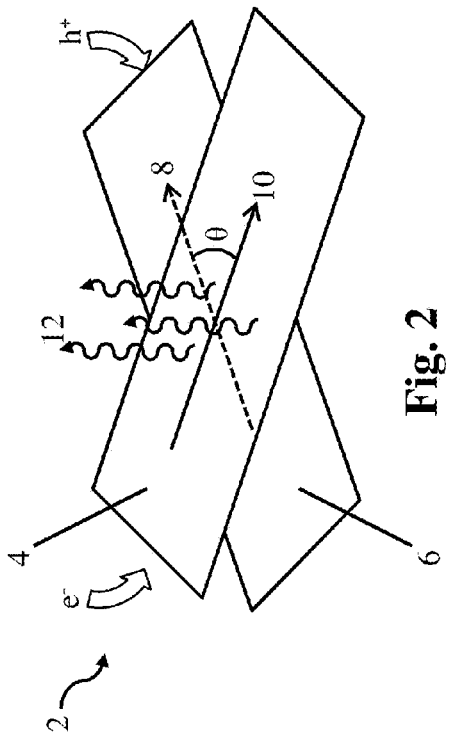
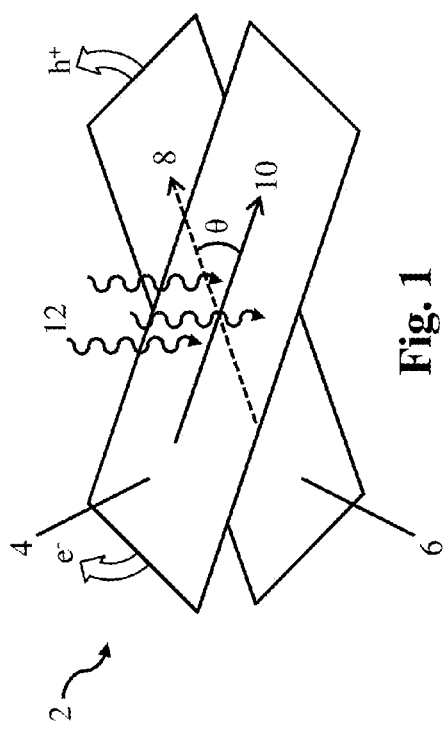
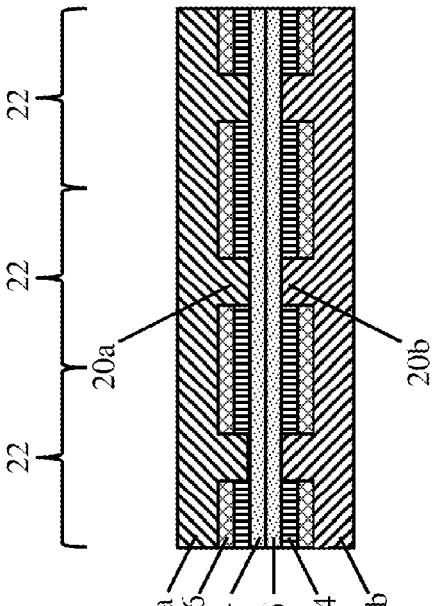
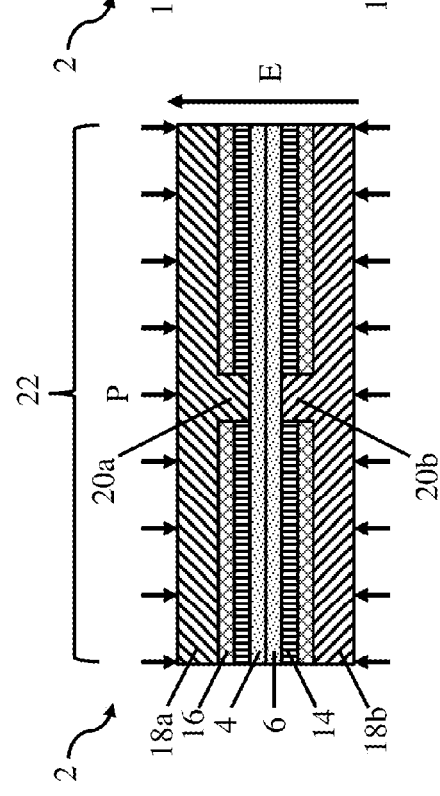

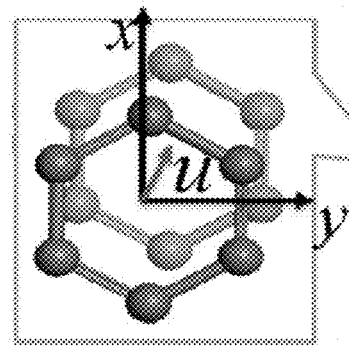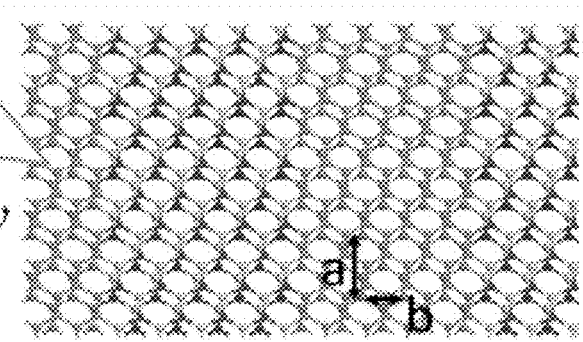
Fig. 12A                    Fig. 12B
Fig. 12C
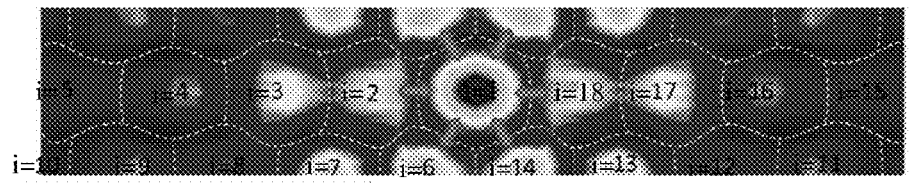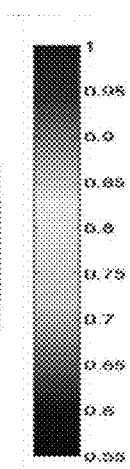
Fig. 12D
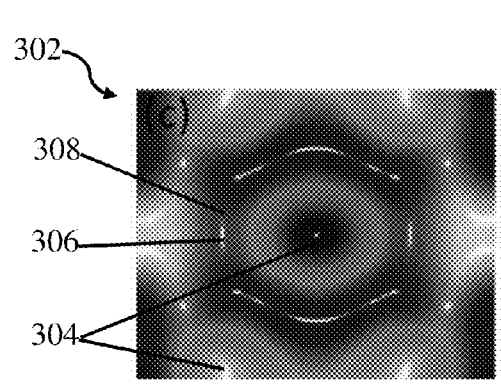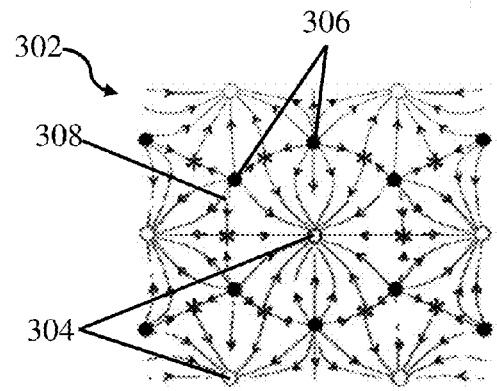
Fig. 12E                    Fig. 12F

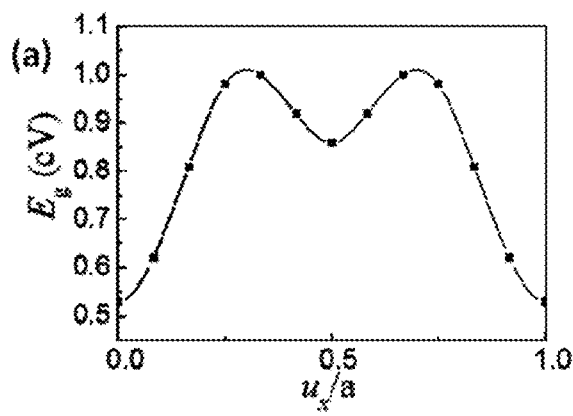
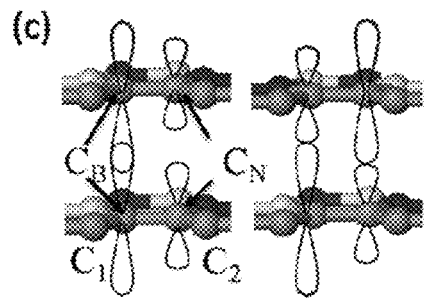
Fig. 15C
Fig. 15A
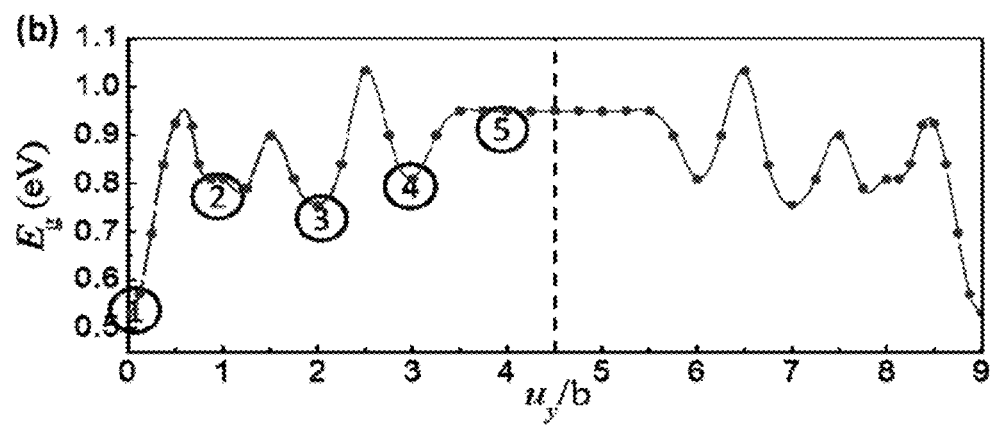
Fig. 15B

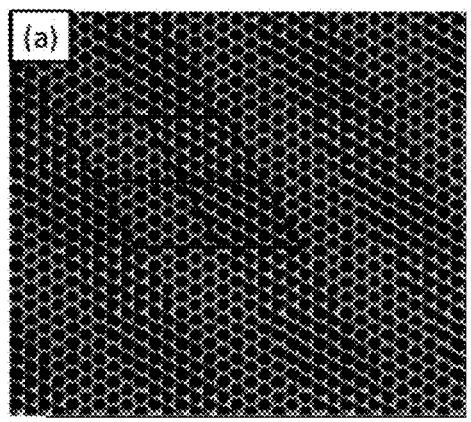
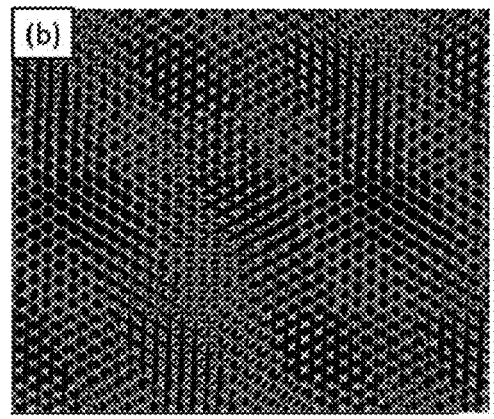
Fig. 16A     Fig. 16B
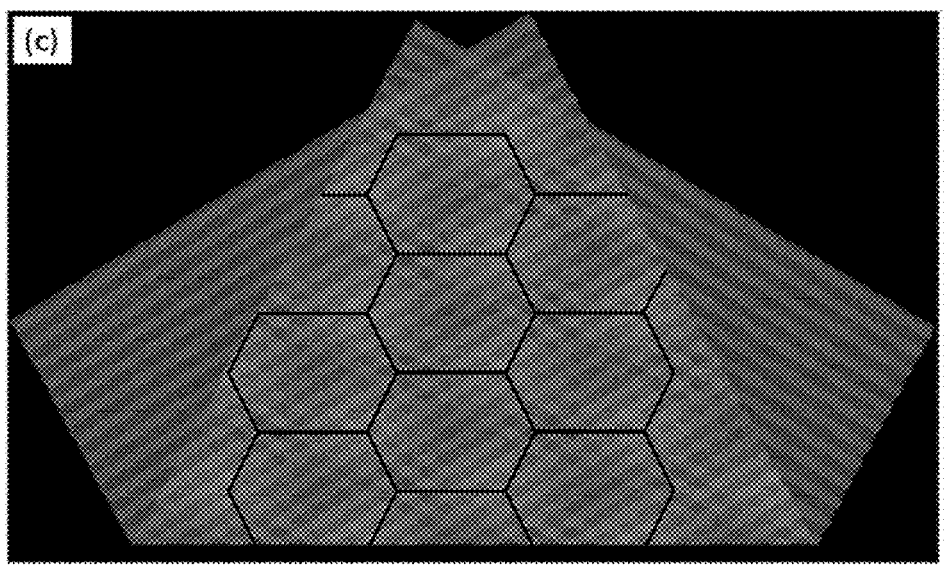
Fig. 16C

ENGINEERED BAND GAPS

CROSS-REFERENCE TO RELATED APPLICATIONS

This application claims the benefit under 35 U.S.C. §119 (e) of U.S. provisional application Ser. No. 62/033,558, filed Aug. 5, 2014, the disclosure of which is incorporated by reference in its entirety.

GOVERNMENT LICENSE RIGHTS

This invention was made with Government support under Grant No. DMR-1120901 awarded by the National Science Foundation. The Government has certain rights in the invention.

FIELD

Disclosed embodiments are related to engineered band gaps.

BACKGROUND

The interaction of light and other electromagnetic radiation with materials is well-studied. One important class of such interactions includes optoelectronic devices, e.g., photovoltaic devices in which exposure of the material to light causes separation of charge in the material, and the flow of electrical current. Typically, in such devices, only a single wavelength (or frequency) of radiation can be utilized by the device to produce current, thus the process is inherently somewhat inefficient. These or similar devices can also be used as radiation emitters, where current is applied, and radiation is emitted from the material, again typically at a single wavelength.

SUMMARY

In one embodiment, an optoelectronic device includes a first semiconducting atomically thin layer having a first lattice direction, and a second semiconducting atomically thin layer having a second lattice direction. The second semiconducting atomically thin layer is proximate the first semiconducting atomically thin layer. Additionally, an angular difference between the first lattice direction and the second lattice direction is between about 0.000001° and 0.5°, or about 0.000001° and 0.5° of a Vicnal angle of the first and second semiconducting atomically thin layers. The optoelectronic device also includes a first charge carrier conductor in electrical communication with the first semiconducting atomically thin layer, and a second charge carrier conductor in electrical communication with the second semiconducting atomically thin layer.

In another embodiment, an optoelectronic device includes a first semiconducting atomically thin layer, and a second semiconducting atomically thin layer proximate the first semiconducting atomically thin layer. The first and second semiconducting atomically thin layers form a Moiré superlattice of exciton funnels with a period between about 50 nm to 3 cm. The optoelectronic device also includes a first charge carrier conductor in electrical communication with the first semiconducting atomically thin layer, and a second charge carrier conductor in electrical communication with the second semiconducting atomically thin layer.

In yet another embodiment, a method of manufacturing an optoelectronic device includes: orienting a first lattice direction of a first semiconducting atomically thin layer relative to a second lattice direction of a second semiconducting atomically thin layer, wherein an angular difference between the first lattice direction and the second lattice direction is between about 0.000001° and 0.5°, or about 0.000001° and 0.5° of a Vicnal angle of the first and second semiconducting atomically thin layers; placing the first semiconducting atomically thin layers proximate to the second semiconducting atomically thin layer; placing a first charge carrier conductor in electrical communication with the first semiconducting atomically thin layer; and placing a second charge carrier conductor in electrical communication with the second semiconducting atomically thin layer.

In yet another embodiment, a method includes: absorbing in a single twisted bilayer, and converting to electrical current, electromagnetic radiation over an excitation energy range that is between or equal to 0 electron volts and 5.0 electron volts wide.

In another embodiment, a method includes: photocatalyzing a reaction using a twisted bilayer material.

It should be appreciated that the foregoing concepts, and additional concepts discussed below, may be arranged in any suitable combination, as the present disclosure is not limited in this respect. Further, other advantages and novel features of the present disclosure will become apparent from the following detailed description of various non-limiting embodiments when considered in conjunction with the accompanying figures. Additionally, in cases where the present specification and a document incorporated by reference include conflicting and/or inconsistent disclosure, the present specification shall control.

BRIEF DESCRIPTION OF DRAWINGS

The accompanying drawings are not intended to be drawn to scale. In the drawings, each identical or nearly identical component that is illustrated in various figures may be represented by a like numeral. For purposes of clarity, not every component may be labeled in every drawing. In the drawings:

FIG. 1 is a schematic representation of two semiconducting atomically thin layers angled relative to one another and functioning as a light absorbing optoelectronic device according to one embodiment;

FIG. 2 is a schematic representation of two semiconducting atomically thin layers angled relative to one another and functioning as a light emitting optoelectronic device according to the embodiment of FIG. 1;

FIG. 3 is a schematic representation of an optoelectronic device including aligned charge carrier conductors according to one embodiment;

FIG. 4 is a schematic representation of an optoelectronic device including unaligned charge carrier conductors according to one embodiment;

FIG. 12A is a schematic representation of the atomic structure and stack translation of a pseudoheterostructure of carbon/boron nitride;

FIG. 12B is a schematic representation of the atomic structure and stack translation of a pseudoheterostructure of carbon/boron nitride;

FIG. 12C is a schematic representation of a Moiré superlattice of the pseudoheterostructure of FIG. 12B with a twist angle of 2.5°;

FIG. 12D is a schematic representation of the calculated exciton funnels formed in the Moiré superlattice of FIG. 12B;

FIG. 12E is a schematic representation of the calculated exciton funnels around i=1 for the Moiré superlattice of FIG. 12B;

FIG. 12F is a schematic representation of the streamlines for the calculated exciton funnels around i=1 for the Moiré superlattice of FIG. 12B;

FIG. 15A is a graph of the calculated bandgap energy of a twisted carbon/boron nitride bilayer along the $u_x$ translation vector;

FIG. 15B is a schematic illustration of carbon π-π it overlapping in a metallic on metallic AA stacking;

FIG. 15C is a graph of the calculated bandgap energy of a twisted carbon/boron nitride bilayer along the $u_y$ translation vector;

FIG. 16A is a schematic representation of a Moiré pattern formed from a twisted carbon/boron nitride bilayer with a twist angle of 60° between the layers;

FIG. 16B is a schematic representation of a Moiré pattern formed from a twisted carbon/boron nitride bilayer with a twist angle of 62.5° between the layers;

FIG. 16C is a schematic representation of a Moiré pattern formed from folding a carbon/boron nitride layer to form a twist angle of 60.25° between the proximate layers;

DETAILED DESCRIPTION

Figure 5:
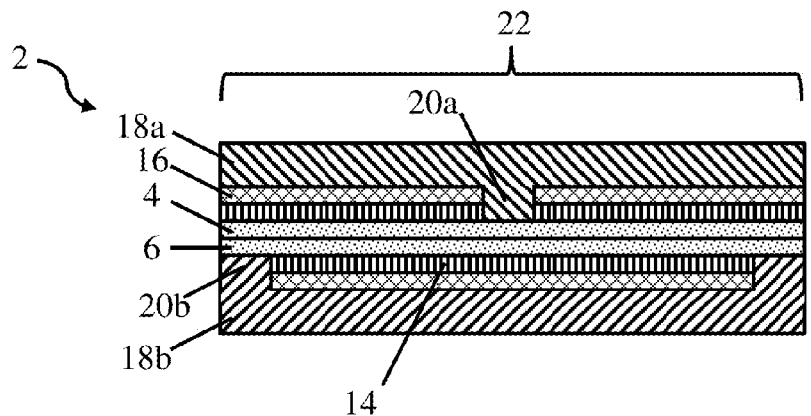
FIG. 5 is a schematic representation of an optoelectronic device including a plurality of charge carrier conductors associated with each semiconducting atomically thin layer according to one embodiment.

The inventors have recognized that an optoelectronic material with a spatially varying band gap as well as the ability to control the band gap in an optoelectronic material at low cost is highly desirable for a wide range of energy and sensing applications such as photovoltaics, photocatalysis, photodetection, bandpass filters for high-frequency applications, and light-emitting devices. For example, the efficiency of photovoltaic devices including a single p-n junction is subject to the thermodynamic constraint of the Shockley-Queisser limit since a single junction is only able to absorb a limited portion of the incident solar energy corresponding to the band gap energies absorbed by that junction. Although tandem solar cells consisting of multi-junctions with cascaded band gaps can achieve a higher absorption efficiency, the increased complexity of fabrication as well as the high cost of materials are still major challenges. Therefore, it would be advantageous if the band gap could be controlled within a single semiconducting material to improve the performance and efficiency of the device.

In view of the above, the inventors have recognized the benefits associated with a spatially varying bandgap that may be used to drive exciton motion and funnel energy within a solid. In some embodiments, this bandgap modulation may be created by introducing a small angular twist between two proximately located semiconducting atomically thin layers. Without wishing to be bound by theory, the twist between the layers introduces an internal stacking translation which varies gently with position which leads to changes in the local bandgap within this twisted bilayer structure. This variation may lead to the formation of a Moiré Superlattice pattern including one or more exciton funnels distributed across the twisted bilayer structure due to the bandgap energy varying across the Moiré Superlattice pattern. Without wishing to be bound by theory, in some embodiments, the exciton funnels may correspond to local bandgap energy minima surrounded by larger bandgap energies around a periphery of the individual exciton funnels.

Without wishing to be bound by theory, a spatially varying band gap may permit an optoelectronic device to absorb a larger portion of the incident light, or to emit a larger spectrum of light, due to the range of band gap energies present in the twisted bilayer as compared to the bulk material. Since a twisted bilayer material may absorb a greater portion of the incident light, and/or emit light across larger ranges of wavelengths in response to an applied current, junctions incorporating such a material may also exhibit a higher efficiency.

In one embodiment, an optoelectronic device includes a twisted bilayer corresponding to a first and second semiconducting atomically thin layers. The first and second semiconducting atomically thin layers include corresponding first and second lattice directions oriented substantially within a plane of the twisted bilayer. The first and second semiconducting atomically thin layers are located proximate to one another such that they are able to interact to form a junction. Additionally, the first and second lattice directions are angled relative to one another thus introducing variations in atomic structure, and correspondingly the bandgap energy, across the twisted bilayer. These variations may result in the formation of a Moiré superlattice pattern of exciton funnels across the twisted bilayer.

For purposes of this application, the terms proximate, disposed on, placed on, and other similar phrases do not necessarily require that the materials or components be in direct contact with one another. Instead, other materials, coatings, and/or components may be positioned between the indicated materials or components so long as they are still able to function as indicated. For example, the first and second semiconducting atomically thin layers located proximate to one another might be functionalized, include an intermediate layer, or other possible arrangements such that they are not in direct contact, but are still able to interact with one another to form a twisted bilayer material as described herein.

In some embodiments, the angle between the first and second lattice directions of the first and second semiconducting atomically thin layers is selected to provide a desired bandgap energy or spectrum of bandgap energies. For example, in one embodiment, the angle between the first and second lattice directions is between about 0.000001° and 0.5°. In certain embodiments, the angle may be greater than about 0.000001°, 0.0001°, 0.01°, 0.1°, or 1°, or any other appropriate angle. Additionally, in some embodiments, the angle may be less than about 0.5°, 0.4°, 0.3°, 0.25°, 0.2°, or any other appropriate angle. Combinations of the above-noted angles may be used. Of course, it should be understood that the particular angle to be used will depend on the crystal structure of the semiconducting atomically thin layers being used. Consequently, angles both greater than and less than those noted above are contemplated.

In the above noted embodiment, the angle between the first and second lattice directions of the first and second semiconducting atomically thin layers is small. However, in some embodiments, the semiconducting atomically thin layers may be oriented about a large special angle, such as a Vicinal "grain boundary" angle, herein referred to as a Vicinal angle. In such an embodiment, the angle between the first and second lattice directions is a Vicnal angle of the semiconducting atomically thin layers plus or minus the above-noted range of angles such as 0.000001° and 0.5° though other angles are also possible. Appropriate Vicinal angles will depend upon the crystal symmetries present in the particular materials being used. For example, a material with twofold symmetry has Vicnal angles of 0° 180°. A material including three-fold symmetry has Vicnal angles of 0°, 120°, and 240°. A material with four-fold symmetry has Vicnal angles of 0°, 90°, 180°, 270°. A material with five-fold symmetry has Vicnal angles of 0°, 72°, 144°, 216°, and 280°. Similarly, a material with six-fold symmetry has Vicnal angles of 0°, 60°, 120°, 180°, 240°, and 300°. While particular Vicnal angles for various material symmetries are noted above, it should be understood that any appropriate angle of a material capable of forming a Moiré superlattice pattern of exciton funnels may be used as the disclosure is not so limited.

Depending upon the desired application, the twisted bilayer may include first and second semiconducting atomically thin layers that are appropriately oriented and positioned to provide a Moiré superlattice pattern with a desired period for a given application. Without wishing to be bound by theory, for periodicities less than about 10 times the desired wavelength, or range of wavelengths, quantum coherence effects begin to dominate and the material properties may become too localized to function as a twisted bilayer material. Therefore, in some embodiments, the periodicity of the pattern may be greater than about 10 times a desired wavelength or range of wavelengths. Similarly, the periodicity of a pattern may be less than about 100 times the desired wavelength or range of wavelengths, though both larger and smaller periodicities are also contemplated. For example, in embodiments where it is desirable to operate in the visible spectrum corresponding to wavelengths between about 380 nm and 700 nm, the Moiré superlattice pattern may have a lattice period that is greater than about 3800 nm, 4000 nm, 5000 nm, 6000 nm, 7000 nm, or any other appropriate distance. Correspondingly, the Moiré superlattice pattern may have a lattice period that is less than about 70,000 nm, 50,000 nm, 30,000 nm, 20,000 nm, 70,000 nm, or any other appropriate length. In view of the above, in one embodiment, an optoelectronic device operating in the visible spectrum may have a twisted bilayer with a Moiré superlattice pattern period between about 3800 nm and 70,000 nm. Similar to the above, a Moiré superlattice pattern period for operating in the ultraviolet spectrum, corresponding to between about 10 nm and 380 nm, may be between about 100 nm and 3800 nm. Additionally, a Moiré superlattice pattern period for operating in the infrared spectrum, corresponding to between about 700 nm and 1 mm, may be between about 7000 nm and 1 cm. It should be understood that a twisted bilayer material capable of operating in any one or more of the infrared, visible, and ultraviolet ranges might be constructed, in which case the Moiré superlattice pattern period may be selected so that it is appropriately sized for the entire spectrum of interest including wavelengths both greater than and less than those noted above. For instance, a lattice period may be between about 50 nm and 3 cm. However, lattice periods both greater than and less than those noted above are contemplated.

In some embodiments, and as described in the examples in more detail, a single twisted bilayer may be used to absorb and/or emit wavelengths of light over a broad spectrum of energies due to the variation in bandgap energy across the material. Depending on the embodiment, the range of excitation energies for the band gaps associated with a twisted bilayer materials may be about 1 eV or more depending on the particular materials used, applied pressures and electric fields, and angular orientations of the bilayers. However, both wider and narrower ranges of excitation energies are possible for both the tested materials as well as other optoelectronic materials. Consequently, in one embodiment the range of excitation energies of a twisted bilayer may be greater than or equal to about 0 eV, 0.2 eV, 0.3 eV, 0.4 eV, 0.5 eV, or any other appropriate energy. Correspondingly, the range of excitation energies of a twisted bilayer may be less than or equal to about 5.0 eV, 4.0 eV, 3.0 eV, 2.0 eV, 1.0 eV, 0.9 eV, 0.8 eV or any other appropriate energy. For example, the excitation energies associated with a twisted bilayer material may be between, and inclusive of, about 0 eV and 5.0 Ev, 0.2 eV and 1.0 eV, or 0.3 eV and 0.9 eV.

While a twisted bilayer may be provided by itself, when incorporated into an optoelectronic device, the first and second semiconducting atomically thin layers of the twisted bilayer may be associated with corresponding charge carrier conductors. In such an embodiment, one or more charge carrier conductors may be associated with each of the first and second semiconducting atomically thin layers in order to extract the generated charge carriers, i.e. electrons and holes. In instances where multiple exciton funnels are created in the twisted bilayer, a charge carrier conductor may either be in electrical communication with an entire surface of the associated semiconducting atomically thin layer, or a charge carrier conductor may have a plurality of electrical contacts associated with a corresponding plurality of exciton funnels. As described in more detail below, the charge carrier conductors on either side of the twisted bilayer may either be aligned at, or arranged around, a center of the associated exciton funnels, or they may be offset from one another depending on the particular application as the disclosure is not limited in this manner. In instances where an exciton funnels is larger than an expected relaxation distance, or recombination length, of an electron hole pair, a charge carrier conductor may have multiple electrical contacts with the exciton funnel spaced less than or equal to the relaxation distance from one another across the exciton funnel. Alternatively, a plurality of separate charge carrier conductors may be associated with the single exciton funnel such that a distance between the charge carrier conductors is less than or equal to the relaxation distance of the exciton funnel. In addition to the above, in some embodiments, the charge carrier conductors may be made from a material that is transparent to the operational wavelengths of the optoelectronic device.

In order for the charge carrier conductors to function properly, it is desirable that they be made from an appropriate material or include appropriate buffer layers between the conductors and the twisted bilayer. The role of these buffer layers is to selectively admit one type of charge carriers (electron or hole) while blocking the other. This helps to suppress direct tunneling of carriers between the anode and cathode and allow for efficient extraction of charge carriers. The desired carrier selectivity is provided by selecting appropriate band alignment which is a standard design principle in photovoltaics. Therefore, the charge carrier conductors may be made of or coated with an appropriate buffer layer material exhibiting the desired band edge. Similar to the above, the buffer layers may be made from a material transparent to the desired operating wavelengths of the optoelectronic device. In one exemplary embodiment, the electron selectively buffer layer and/or the charge carrier conductor is made from $HfS_2$ and the hole selective buffer layer and/or charge carrier conductor is made from $ReS_2$. Other appropriate materials are also contemplated.

For the sake of clarity, the embodiments described herein are primarily directed to an optoelectronic device that absorbs incident light energy where the charge carrier conductors function as charge carrier collectors. Though, it should be understood that the currently described optoelectronic devices may also be used as emitters in which case the charge carrier conductors function as are charge carrier injectors. Examples of possible applications of a twisted bilayer include, but are not limited to, engineered solar cells, solar energy funnels, light emitting diodes, optomechanical sensors, and/or photodetectors. If an appropriate resonator is devised for these materials, another possible application is exciton lasing due to the exciton concentrating at the center of the exciton funnels followed by radiative recombination which may result in stronger luminescence near the center of the funnels.

In some instances, it may be desirable to maintain a constant orientation of the lattice parameters of the first and second layers across an entire twisted bilayer material to provide consistent controllable properties across the material. In such an embodiment, the first and second layers of the twisted bilayer may be single crystals. Consequently, the alignment and orientation of the layers at any single point result in the alignment and orientation of the layers across the entire material. However, embodiments in which the layers include multiple crystalline domains are also contemplated as the disclosure is not so limited.

Regarding semiconducting atomically thin layers used in a twisted bilayer structure, it should be understood that an atomically thin layer may correspond to any appropriate thickness of material capable of functioning in a twisted bilayer structure to provide a desired modification and/or range of bandgap energies for the material. For example, an atomically thin layer may include multiple atomic layers ranging from about 0.3 nm to several nanometers thick. This may correspond to a number of atomic layers ranging from about 1 atomic layers to about 10 atomic layers. In view of the above, the atomically thin materials noted herein may range from a monolayer including a single atomic layer to a material including multiple atomic layers as the disclosure is not so limited.

Depending on the particular embodiment, the materials of the first and second semiconducting atomically thin layers may be the same material. In such an embodiment, the first and second lattice directions may correspond to the same lattice direction of the same crystal structure. Such a configuration might be referred to as a pseudohetero structure since both layers contain the same material but may still function as a hetero junction with a bandgap energy. However, while the majority of embodiments, and the examples provided below, are directed to pseudohetero structures, embodiments in which the two layers are made from different materials are also contemplated. In such an embodiment, the first and second lattice directions may correspond to the same or different lattice directions depending upon the particular crystal structures of the first and second semiconducting atomically thin layers.

Due to the first and second layers of a twisted bilayer being made from atomically thin materials, the resulting device may be susceptible to damage from various sources such as applied pressure, vibration, wear, and contact to name a few possible damage sources. Consequently, in some embodiments, it may be desirable to provide one or more protective layers on an external surface of one or more of the semiconducting atomically thin layers. In instances where charge carrier conductors are used, the one or more protective layers may be located between the charge carrier conductors and the semiconducting atomically thin layers. Additionally, in order to provide electrical contact between the charge carrier conductors and the underlying semiconducting atomically thin layers, the protective layers may have one or more openings in them to form an electrical contact between the charge carrier conductors and the semiconducting atomically thin layers. It should be understood that the protective layers may be formed from any appropriate material which is substantially chemically inert with the semiconducting atomically thin layers and is capable of forming a sufficiently flat surface on which to place and/or form subsequent layers. In some embodiments, the protective layer may form a substantially atomically flat surface. In addition to the above, the protective layers may be transparent to a wavelength of interest for a particular optoelectronic device and/or sufficiently thin to permit the optoelectronic device to function at a wavelength of interest. Examples of appropriate protective layer materials include, but are not limited to, boron nitride, mica, and silicon carbide to name a few.

Depending on the particular material being used, the bandgap of an optoelectronic material may be varied through the use of pressure. Additionally, bilayer structures made from the atomically thin materials discussed herein are relatively soft out of plane as compared to their in plane properties. Consequently, in some embodiments, a compressive element may be used to apply a pressure normal to the first and second semiconducting atomically thin layers of a bilayer structure to provide a desired change in the bandgap energy. Therefore, in one embodiment, the applied pressure is greater than about 0.5 GPa, 1 GPa, 2 GPa, or any other appropriate pressure. Correspondingly, the pressure may be less than about 3 GPa, 2 GPa, or any other appropriate pressure. Combinations of the above noted pressures may be used. For example, the applied pressure may be between about 1 GPa and 3 GPa. One appropriate device for applying pressures of these magnitudes includes, but is not limited to, a diamond anvil. While specific pressures are noted above, it should be understood that any appropriate pressure, including pressures both greater than and less than those noted above, may be used to vary a bandgap energy of the material as the disclosure is not so limited.

In addition to the use of pressure, the bandgap energy of a twisted bilayer material may also be varied through the use of an applied electric field. Consequently, in some embodiments, an optoelectronic device may include a capacitor, or other appropriate structure, to apply an electric field oriented normal to the first and second semiconducting atomically thin layers of the device. A magnitude of the applied electric field may be between about $0.5 \times 10^9$ V/m and $3 \times 10^9$ V/m. However, electric fields both greater than and less than those noted above may be used depending on the particular material and desired change in bandgap energy. Since the capacitive plates, or other appropriate structures, used to create the electric field will likely be aligned with the first and second semiconducting atomically thin layers, it may be desirable to ensure that the wavelength of interest for a particular optoelectronic device is capable of passing through, or around the capacitive plates or other structures. Therefore, in some embodiments, the capacitor, or other structure, may be formed using conductive materials that are either transparent to the wavelength of interest or sufficiently thin to permit the device to function at a given wavelength. For example, an electrically conductive transparent oxide might be used to form the various components of the capacitor or other device. Alternatively, the component generating the electric field may only be applied to a portion of the semiconducting layers such that the components are able to generate an electric field across the twisted bilayer while still permitting the wavelength of interest to reach a majority of the underlying semiconducting layers. For example a grid of metalized conductive traces might be formed on the twisted bilayer. While particular arrangements for generating an electric field are described above, it should be understood that other configurations are also contemplated.

Having described the various optoelectronic devices above, a method for forming an optoelectronic device is described in more detail below. In one embodiment, a first semiconducting atomically thin layer is oriented relative to a second semiconducting atomically thin layer such that an angle between selected lattice directions of the two layers corresponds to the angles described in more detail above. The two layers are then placed proximate to one another prior to placing a first charge carrier conductor and a second charge carrier conductor in electrical communication with the corresponding semiconducting atomically thin layers. In one specific embodiment, the two semiconducting atomically thin layers are oriented and placed proximate to one another by folding a single semiconducting atomically thin layer at a particular angle to form and proximately locate the semiconducting atomically thin layers at a desired orientation. Alternatively, in another embodiment, the first and second semiconducting atomically thin layers are separately attached to corresponding carrier substrates. The carrier substrates are then appropriately positioned and oriented to position the lattice directions of the semiconducting atomically thin layers at the desired angle prior to displacing the carrier substrates towards one another to bring the semiconducting atomically thin layers proximate to one another. In some embodiments, the carrier substrates may be the charge carrier collectors. In such an embodiment, the charge carrier collectors might be constructed and arranged to permit them to be rotated to change a twist angle of the twisted bilayer to dynamically change the properties of the material. Though, embodiments in which the carrier substrates are subsequently removed from the semiconducting atomically thin layers are also contemplated. While two particular methods for forming the twisted bilayer material are noted above, other various methods of appropriately orienting and placing two atomically thin layers proximate one another are also contemplated. Consequently, the current disclosure should not be limited to only those methods of orienting and placing two layers proximate one another described herein.

In some embodiments, it is desirable to attach the semiconducting atomically thin layers of a twisted bilayer structure to one another to form a functional material. In such an embodiment, and without wishing to be bound by theory, the atomically thin layers are brought close enough to one another such that the free energies of their surfaces favor bonding to one another. One way in which to accomplish this is to apply a sufficient compressive pressure normal to the first and second semiconducting atomically thin layers to initiate contact adhesion crack closure to form a single bonded twisted bilayer material. For example, pressures between about 1 MPa and 10 GPa might be used. However, it should be understood that other methods of bonding the layers are also contemplated.

In some instances, the semiconducting atomically thin layers used to form a twisted bilayer may be prone to wrinkling and buckling of the material during formation of the twisted bilayer. Such defects are undesirable in a final material. Consequently, in some embodiments, the semiconducting atomically thin layers are placed under tension prior to placing them proximate one another, and/or prior to bonding to one another. By tensioning the semiconducting atomically thin layers, this may help to ensure that the layers are substantially flat and in contact across substantially their entire active surfaces. For example, a tension of about 0.01 N/m might be used, though tensions both greater than and less than this might also be used depending on the material.

In order to accurately position the charge carrier conductors, and/or the electrical contacts between the charge carrier conductors and the associated exciton funnels, it is desirable to first identify a center of at least one exciton funnel and an orientation of the Moiré superlattice formed by the twisted bilayer. The center of the at least one exciton funnel and orientation of the Moiré superlattice may be determined using any appropriate measurement technique including, but not limited to, light based microscopy, scanning electron microscopy, tunneling electron microscopy, and real-time x-ray imaging to name a few. Once at least one exciton funnel center has been identified and the orientation of the Moiré superlattice has been determined, it is possible to extrapolate the locations of the other exciton funnel centers using the periodicity and lattice vectors of the Moiré superlattice. Consequently, first and second charge carrier conductors may be placed in electrical contact with the first identified exciton funnel and third and fourth charge carrier conductors may be placed in electrical contact with a second exciton funnel at a location extrapolated from the location of the first exciton funnel. Such a process may be continued for any number of desired exciton funnels within a twisted bilayer material assuming that appropriate tolerances and accuracies are maintained. Once the extrapolated locations exceed a preset tolerance or accuracy, an additional exciton funnel location and orientation may be measured in order accurately extrapolate additional exciton funnel locations.

The various protective and conductive layers associated with a twisted bilayer material may be formed in any appropriate manner. For example, depending on the particular embodiment and layer being formed, electron beam evaporation, thermal evaporation, laser ablation, chemical vapor deposition, thermal evaporation, plasma assisted chemical vacuum deposition, laser enhanced chemical vapor deposition, jet vapor deposition, and spin-coating techniques might be used to form one or more of the various layers associated with the twisted bilayer material as the disclosure is not limited to any particular method of depositing or forming materials.

The twisted bilayer materials may use any appropriate semiconducting atomically thin layers capable of forming a varying bandgap in response to misalignments between the two layers. Appropriate materials include, but are not limited to: carbon/boron nitride (CBN); gallium(II) sulfide (GaS); gallium(II) selenide (GaSe); gallium(II) telluride (GaTe); graphitic carbon nitride; hexagonal boron nitride (h-BN); carbon nitride ($C_3N_4$); phosphorene; $MX_2$ type of dichalcogenides where M=Mo, Nb, Ni, Sn, Ti, Ta, Pt, V, W, or Hf and X=S, Se, or Te; $M_2X_3$ type of trichalcogenides where M=As, Bi, or Sb and X=S, Se, or Te; $MPX_3$ where X=S or Se; $MAX_3$ where A=Si or Ge and X=S, Se, or Te; and alloy sheet like $M_yM'_{1-y}X_2$. Several specific possible materials include, but are not limited to, molybdenum disulfide ($MoS_2$), molybdenum diselenide ($MoSe_2$), molybdenum ditelluride ($MoTe_2$), tungsten disulfide ($WS_2$), tungsten diselenide ($WSe_2$), tungsten ditelluride ($WTe_2$), chromium disulfide ($CrS_2$), chromium diselenide ($CrSe_2$), chromium ditelluride ($CrTe_2$), gallium arsenide nanosheet, germanium nanosheet, gallium indium phosphide nanosheet, graphene oxide, rhenium disulphide ($ReS_2$), rhenium diselenide ($ReSe_2$), tin disulfide ($SnS_2$), and tin diselenide ($SnSe_2$).

Simple screening tests may be used to determine if a material is appropriate for use in a twisted bilayer material. For example, first and second semiconducting atomically thin layers of the desired material may be oriented at a small angle, such as 0.25°, and/or any other appropriate angle as described herein, and placed proximate to one another. The resulting absorption spectra may then be measured relative to the bulk material to determine if the resulting material exhibits enhanced bandgap properties. Possible experimental methods to evaluate the electron and hole energy levels and optical absorption spectra of the bulk and twisted bilayer materials include, but are not limited to, electrical transport measurement, angle-resolved photoemission spectroscopy, and photoluminescence spectroscopy. In addition to the above, the computational methods described below as well as several simple experimental methods may be used to evaluate the band gap energies of a material as well as their potential for being used in a twisted bilayer material. First-principles computational methods that may be used include, but are not limited to, density-functional theory (DFT), time-dependent density functional theory (TDDFT), many-body Green's function method within quasiparticle approximation, and Bethe-Salpeter equation (BSE) can be used to name a few.

Turning now to the figures, several nonlimiting embodiments and examples are described in more detail. While specific embodiments are described, it should be understood that other ways of implementing an optoelectronic device including a twisted bilayer are contemplated. Consequently, the current disclosure should not be limited to only those embodiments described herein, and should be interpreted more generally as describing twisted bilayers, their methods of manufacture and use, and their inclusion in various types of optoelectronic devices.

FIGS. 1 and 2 depict an optoelectronic device 2 including a twisted bilayer corresponding to first and second semiconducting atomically thin layers 4 and 6 arranged proximate to one another. As noted above, the atomically thin layers may either correspond to several atomic layers and/or a monolayer. Additionally, in some embodiments, the semiconducting atomically thin layers are single crystals. As depicted in the figures, a lattice direction 8 of the first semiconducting atomically thin layer is twisted relative to a lattice direction 10 of the second semiconducting atomically thin layer. These lattice directions are twisted, or angled, relative to one another by an angle θ to form a plurality of separate exciton funnels. Depending on the particular embodiment, the separate exciton funnels may have different discrete ranges of bandgap energies. Once appropriately oriented and arranged proximate to one another, the first and second semiconducting atomically thin layers may either be used to absorb or emit light in a particular application.

Referring to FIG. 1, when light 12 within a given spectrum is incident upon the surface of one or both of the semiconducting atomically thin layers 4 and 6, the light is absorbed by the twisted bilayer resulting in the creation of an exciton at the junction between the two layers. As described in more detail below, the electrons e⁻ and holes h are subsequently extracted from the two layers to produce an electric current. Alternatively, as depicted in FIG. 2, electrons e⁻ and holes h may also be separately injected into the first and second semiconductor atomically thin layers. The electrons and holes then recombine within the resulting twisted bilayer and emit light 12 within a given range of spectrums. The wavelength of light emitted from the twisted bilayer material formed by the two semiconducting atomically thin layers will depend on the bandgap energy spectrums of the associated exciton funnels. In embodiments where the exciton funnels have different energy ranges, different colors of light, e.g. different wavelengths, will be emitted from the plurality of exciton funnels.

FIG. 3 depicts one embodiment of an optoelectronic device 2 including several additional structures. The device again includes first and second semiconducting atomically thin layers 4 and 6 used to form a twisted bilayer. The optoelectronic device also includes two charge carrier conductors 18a and 18b. The charge carrier conductor 18a is in electrical communication with the first semiconducting atomically thin layer 4. Similarly, the charge carrier conductor 18b is in electrical communication with the second semiconducting atomically thin layer 6. Depending on the embodiment, the charge carrier conductors may either be in electrical communication along an entire interface between the corresponding semiconducting atomically thin layer, or they may be in electrical communication with the corresponding layers at individual locations via one or more electrical contacts 20a and 20b. As described in more detail below, the electrical contacts may be associated with individual exciton funnels located within the twisted bilayer formed by the first and second semiconducting atomically thin layers. It should be understood that the charge carrier conductors may either be in direct contact with the first and second semiconducting atomically thin layers or they may have other intervening layers positioned between them as indicated in figure.

As noted above, in some embodiments, it may be desirable to apply a pressure P normal to the first and second semiconducting atomically thin layers in order to modify the bandgap energy of the material using an appropriate compressive element such as a diamond anvil. In such an embodiment, and in embodiments where it is desirable to protect the twisted bilayer for any number of reasons, the optoelectronic device may include a protective layer 14 formed on the two exterior surfaces of the first and second atomically thin layers. However, in some embodiments, other intervening layers may be positioned between the protective layers and the first and second semiconducting atomically thin layers. The protective layers may be of sufficient thickness and hardness to help protect the first and second atomically thin layers from damage during manufacturing and use. As noted above, the protective layers may also be transparent to a desired wavelength or spectrum of wavelengths and/or sufficiently thin to permit transmission of light for use in an optoelectronic device. When an insulating protective layer is used, the protective layer may also include one or more openings in order to permit one or more electrical contacts, such as 20a and 20b, to be formed between the charge carrier conductors and the first and second semiconducting atomically thin layers.

In embodiments where it is desirable to vary the bandgap energy of a twisted bilayer material with an electric field E oriented normal to the first and second semiconducting atomically thin layers 4 and 6, the optoelectronic device may include two opposing conductive layers 16 positioned on either side of the semiconducting atomically thin layers. These two opposing conductive layers function as two opposing capacitive plates with the twisted bilayer corresponding to the first and second semiconducting atomically thin layers positioned between them. In some embodiments, the conductive layers are two metallized layers that are either sufficiently thin, or appropriately constructed and arranged, to permit light to reach the bilayer while still functioning as a capacitor. For example, traces, a metallized grid, isolated plates, or any other appropriate structures might be applied to the surfaces of the protective layers to form portions of a capacitor. Alternately, a conductive transparent oxide might be used which would help to reduce, and/or eliminate, the need to limit a thickness or coverage of the conductive layers to form the capacitor. It should be understood that while the conductive layers are described as being disposed on the protective layers, other positions and configurations are also contemplated. For example, an electric field might be applied by a separate capacitor unconnected to the optoelectronic device, or another appropriate component capable of applying the desired electric field might be used.

As described in more detail below, depending upon the particular drift direction of the electrons and holes within a twisted bilayer, the electrical contacts on either side of the twisted bilayer may be aligned differently. FIG. 4 depicts one embodiment of a optoelectronic device 2 including a twisted bilayer formed from semiconducting atomically thin layers 4 and 6. The twisted bilayer includes a plurality of exciton funnels 22 distributed across the material and corresponding pairs of electrical contacts 20a and 20b in electrical communication with each exciton funnel. As depicted in the figure, in embodiments where the electron and hole of an exciton drift in the same direction towards the center of the exciton funnels 22, the pairs of electrical contacts 20a and 20b located on either side of the twisted bilayer are aligned with one another. More specifically, the electrical contacts may be preferably formed in the center of the exciton funnels. In contrast, in some embodiments, such as under an applied biasing voltage, the electrons and holes of an exciton may drift in separate directions. For example, the electrons might drift towards a center of the exciton funnel and the holes might drift towards an exterior of the exciton funnel. In such an embodiment, the electrical contacts with the charged carrier conductors on either side of the semiconductor atomically thin layers may be unaligned with one another as depicted in FIG. 5. For example, in one embodiment, the electrical contact 20a may be located in a center of the exciton funnel 22 and electrical contacts 20b may be located along an exterior edge of the exciton funnel 22. Similar to the embodiment depicted in FIG. 4, this type of arrangement may be applied to multiple exciton funnels as well.

Figure 6:
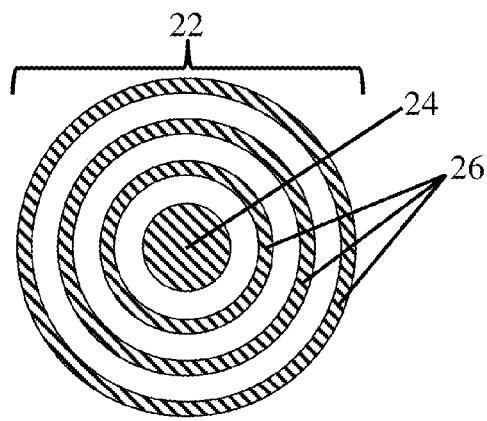
FIG. 6 is a schematic representation of multiple charge carrier conductors associated with a single exciton funnel according to one embodiment.

Without wishing to be bound by theory, the electron-hole pairs formed in an optoelectronic material, including twisted bilayers, recombine after a certain amount of time. Due to the drift of the electron-hole pairs within the optoelectronic material, this corresponds to a recombination length. Further, in order to maximize the device efficiency it is desirable to collect these charge carriers prior to their recombination. Therefore, in some embodiments the parameters of a twisted bilayer are selected to provide exciton funnels with widths that are less than a recombination length of the electron-hole pairs/excitons. Alternatively, in embodiments using twisted bilayers with exciton funnels having widths larger than the recombination length of an electron hole pair in the material, a plurality of charge carrier conductors may be in electrical communication with an individual exciton funnel. The plurality of charge carrier conductors may be spaced such that the distance between the electrodes is equal to or less than the recombination length of the electron hole pairs. One possible embodiment is depicted in FIG. 6. In the depicted embodiment, a plurality of charge carrier conductors 20 are spaced across an exciton funnel 22. Specifically, the exciton funnel 22 is in electrical communication with a central charge carrier conductor 24 as well as a plurality of concentrically arranged charge carrier conductors 26. The distance between the central charge carrier conductor and the next concentrically arranged charge carrier conductor as well as the distance between the other concentrically arranged charge carrier conductors is less than or equal to the recombination length of the electron hole pairs within the twisted bilayer. It should be understood, that the depicted charge carrier conductors are adapted to selectively collect a single charge carrier. A corresponding plurality of charge carrier conductors associated with selectively collecting the other charge carrier may be arranged on the opposite side of the twisted bilayer. Additionally, while the plurality of concentrically arranged circular charge carrier conductors have been depicted in the figure, it should be understood that other arrangements and shapes of a plurality of charge carrier conductors associated with a single exciton funnel are also contemplated.

Depending on the particular optoelectronic material used and the orientation of the semiconducting atomically thin layers within a twisted bilayer, the recombination length may be on the order of about 500 nm to about 5 μm. Consequently, the distance between the plurality of charge carrier conductors may be less than or equal to about 500 nm, 750 nm, 1 μm, 2 μm, 3 μm, 4 μm, 5 μm, or any other appropriate distance. Distances between the plurality of charge carrier conductors that are both greater than and less than those noted above are also contemplated. Additionally, embodiments in which the distance the plurality of charge carriers conductors is greater than a recombination distance of the electron hole pair twisted bilayer material are also contemplated.

Without wishing to be bound by theory, due to the use of a thin sheet of material, an optoelectronic device including a single twisted bilayer may not absorb all of the incident electromagnetic radiation. Instead, a portion of the electromagnetic radiation may be transmitted through the twisted bilayer. Therefore, it may be desirable to try and capture the remaining unabsorbed portion of incident electromagnetic radiation. There are several ways in which to try and capture the remaining unabsorbed portion of the incident electromagnetic radiation.

Figure 7:
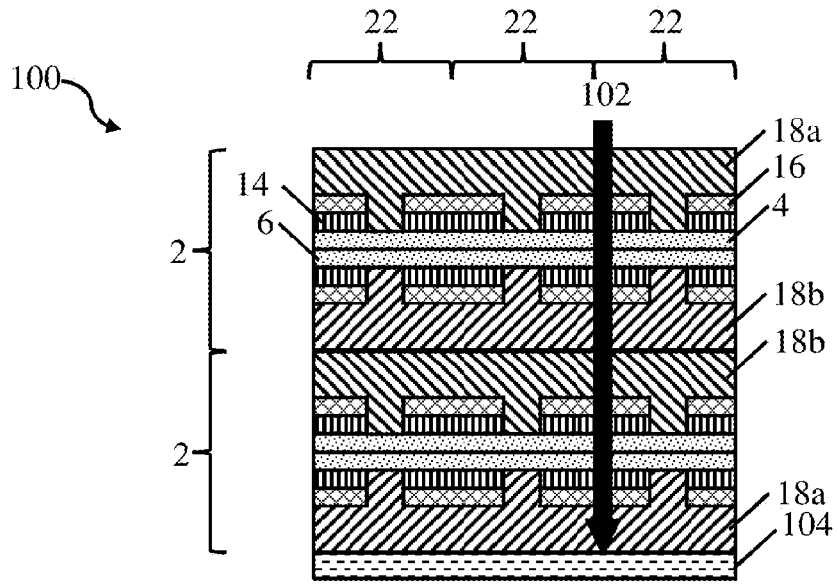
FIG. 7 is a schematic representation of an optoelectronic device assembly.

FIG. 7 illustrates two possible methods for increasing the absorption of the incident electromagnetic radiation 102. The figure depicts a cross-section of an optoelectronic device assembly 100 including multiple optoelectronic devices 2 disposed on top of one another. The optoelectronic devices are oriented such that the corresponding charge carrier conductors 18a and 18b of each optoelectronic device match that of the adjacent optoelectronic device. However, embodiments in which the adjacent charge carrier conductors of separate optoelectronic devices are different from one another are also contemplated. In such an embodiment, an insulating layer, not depicted, may be positioned between the two different charge carrier conductors. In some embodiments, exciton funnels 22 with similar bandgap energy spectrums are aligned with one another. However, embodiments in which the exciton funnels 22 of the separate optoelectronic devices are not specifically aligned with one another are also contemplated. By juxtaposing the separate optoelectronic devices 2, the unabsorbed portion of the electromagnetic radiation 102 that is transmitted through a twisted bilayer of a single optoelectronic device 2 may be absorbed by the one or more underlying twisted bilayers of the separate optoelectronic devices. It should be understood, that any number of juxtaposed optoelectronic devices and associated twisted bilayers may be used. In some embodiments, the materials used to form the electrodes and/or the charge carrier conductors are transparent to minimize absorption losses of the incident electromagnetic radiation.

In addition to the use of juxtaposed optoelectronic devices, a reflective layer 104 may also be provided on a bottom surface of the assembly 100 to reflect the unabsorbed portion of the electromagnetic radiation 102 to improve an efficiency of the assembly. By arranging the reflective layer 104 on the bottom surface of the device, the electromagnetic radiation 102 is reflected back along its original path and passes through the separate optoelectronic devices 2 a second time thus increasing the absorption efficiency of the device.

Figure 8:
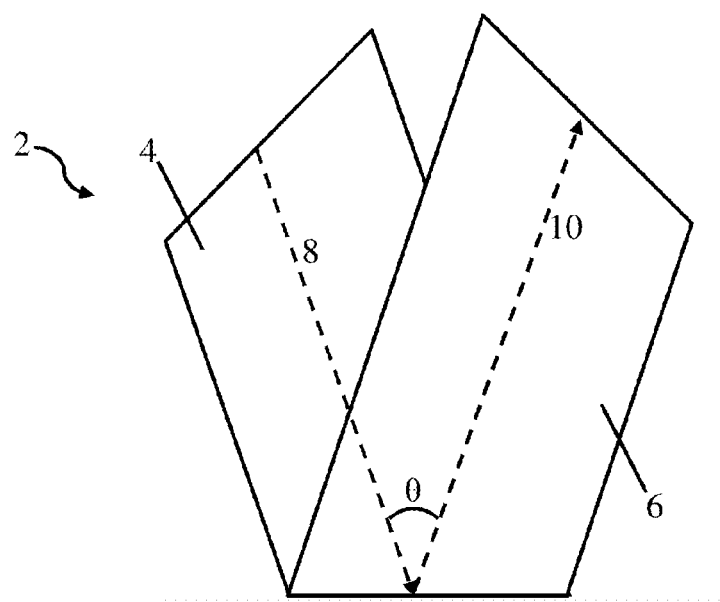
FIG. 8 is a schematic representation of a semiconducting atomically thin layer folded on itself to form a Moiré superlattice according to one embodiment.

FIG. 8 depicts one embodiment of a method to form an optoelectronic device 2 including a twisted bilayer. In the depicted embodiment, after determining a lattice direction of a single semiconducting atomically thin layer, the layer is folded onto itself to form two semiconducting atomically thin layers 4 and 6 proximate to one another. The folding angle is selected such that the lattice directions 8 and 10 of the two layers are arranged at a desired angle θ relative to one another as described above. The single semiconducting atomically thin layer used to form the resulting twisted bilayer may have any desired size and/or shape. Additionally, the resulting twisted bilayer may be incorporated into any appropriate optoelectronic device as described herein.

Figure 9:
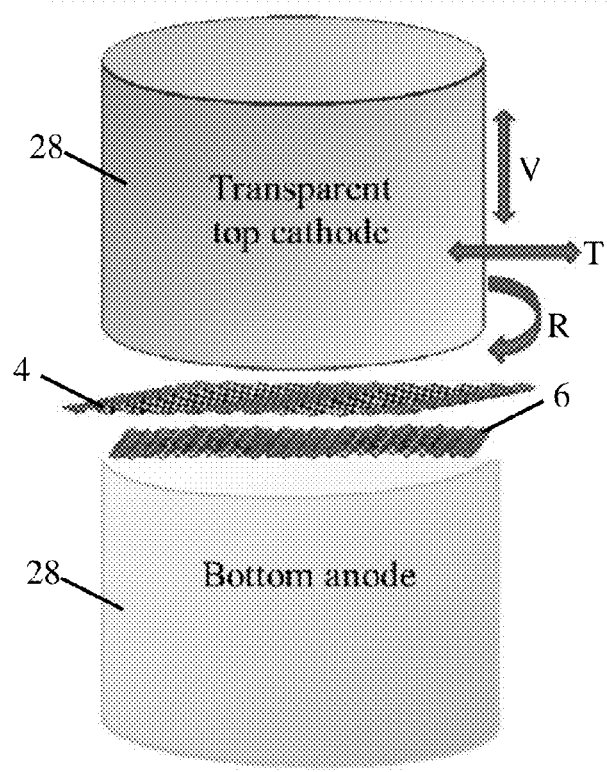
FIG. 9 is a schematic representation of two separate semiconducting atomically thin layers associated with separate carriers for orienting and placing the layers proximate one another to form a Moiré superlattice according to one embodiment.

FIG. 9 depicts another embodiment of a method to form an optoelectronic device 2 including a twisted bilayer. In the depicted embodiment, carrier substrates 28 are attached to corresponding semiconducting atomically thin layers 4 and 6. After determining a lattice direction of the two semiconducting atomically thin layers, the layers are appropriately oriented and positioned through the location and orientation of the carrier substrates. For example, the carrier substrates might be rotated in direction R about their axes to provide a desired orientation of the lattice directions of the first and second semiconducting atomically thin layers, or the carrier substrates might be translated in a direction T parallel to the layers. Once appropriately positioned and oriented, the carrier substrates may be displaced in a direction V towards one another to place the first and second semiconducting atomically thin layers proximate to one another to form the twisted bilayer. Depending on the particular embodiment, the carrier substrates may subsequently be removed through an appropriate etching and/or delamination process.

In some embodiments, the carrier substrates may be the charge carrier conductors of an optoelectronic device. In such an embodiment, the charge carrier conductors may be made from appropriate conductive material that is also transparent and/or sufficiently thin enough to permit electromagnetic radiation of the desired wavelengths to pass through for operation of the optoelectronic device. The device may also include appropriate buffer layers between the conductors and the bilayer if needed. In some embodiments, the charge carrier conductors may be used to dynamically translate the two semiconducting atomically thin layers of the bilayer either vertically in direction V to change the interlayer distance as well as horizontally in direction T and/or rotationally in direction R to tune the parameters of the resulting Moiré superlattice of the twisted bilayer. Therefore, the bandgap energies resulting from the Moiré superlattice may be dynamically changed to provide a twisted bilayer material with a desired absorption and/or emission spectrum with a desired bandgap variation.

The materials in the arrays and individual devices described above may be manufactured in any appropriate manner including, for example, chemical vapor deposition, physical vapor deposition, hydrothermal synthesis, intercalation-assisted exfoliation, mechanical exfoliation, electrochemical synthesis, and thermolysis of precursors to name a few. Similarly, the openings in the various supports and layers may be generated in any appropriate fashion including, but not limited to, ion-bombardment, electron beam milling, selective etching, photolithography, and reactive ion etching.

Figure 10:
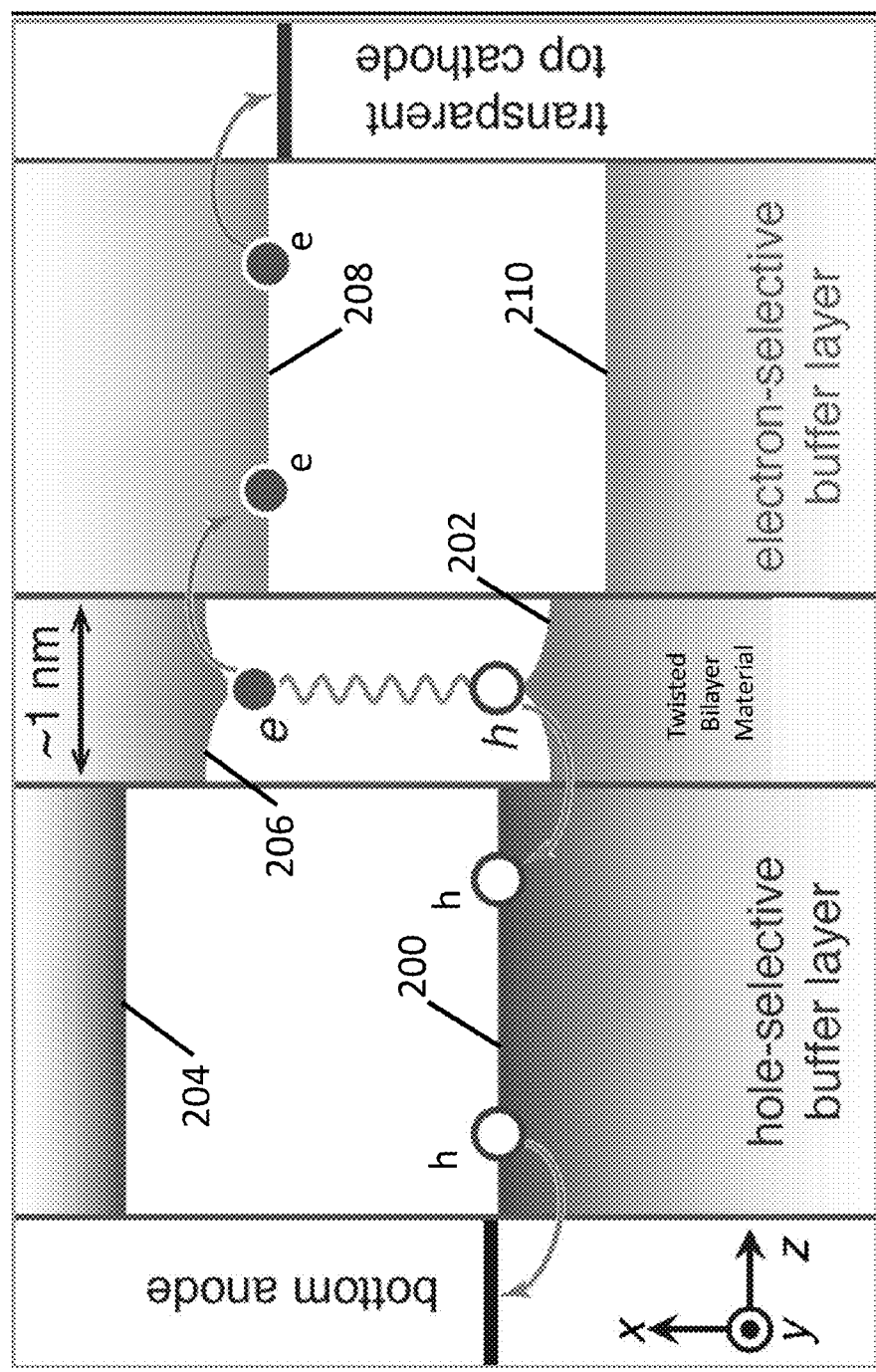
FIG. 10 is a schematic representation of the flow of electrons and holes within an optoelectronic device.

Regardless of whether or not the band gap energy spectrum of an optoelectronic device material is static or dynamic, the buffer layers present within an optoelectronic device may be selected to control the charge extraction from the optoelectronic material. A schematic representation of charge extraction near the center of twisted bilayer made using two semiconducting atomically thin layers is depicted in FIG. 10. As depicted in the figure, the twisted bilayer is oriented parallel to the xy plane. When an electron hole pair is formed in the twisted bilayer, the electrons e are transferred to the electron selective buffer layer and subsequently to the cathode. Similarly, the holes h are transferred to the hole selective buffer layer and subsequently to the anode. Without wishing to be bound by theory, the selective transfer of holes and electrons is dictated by the relative levels of the conduction band edges and valence band edges of the various materials. More specifically, in the depicted embodiment, the hole selective buffer layer material, has a valence band edge 200 that matches with or is a little bit higher than the twisted bilayer's valence band edge 202, and its conduction band edge 204 is higher than the twisted bilayer's conduction band edge 206. Similarly, the electron selective buffer layer material has a conduction band edge 208 that matches with or is a little bit lower than the twisted bilayer's conduction band edge 206, and its valence band edge 210 is lower than the twisted bilayer's valence band edge 202. In this setup, holes can only upflow (move in the direction of increasing band energy) to the anode through the hole selective buffer layer, while electrons can only downflow (move in the direction of decreasing band energy) to the cathode through the electron selective buffer layer. Thus, direct tunneling of electrons and holes from the optoelectronic material to the anode and cathode respectively is substantially blocked.

Figure 11:
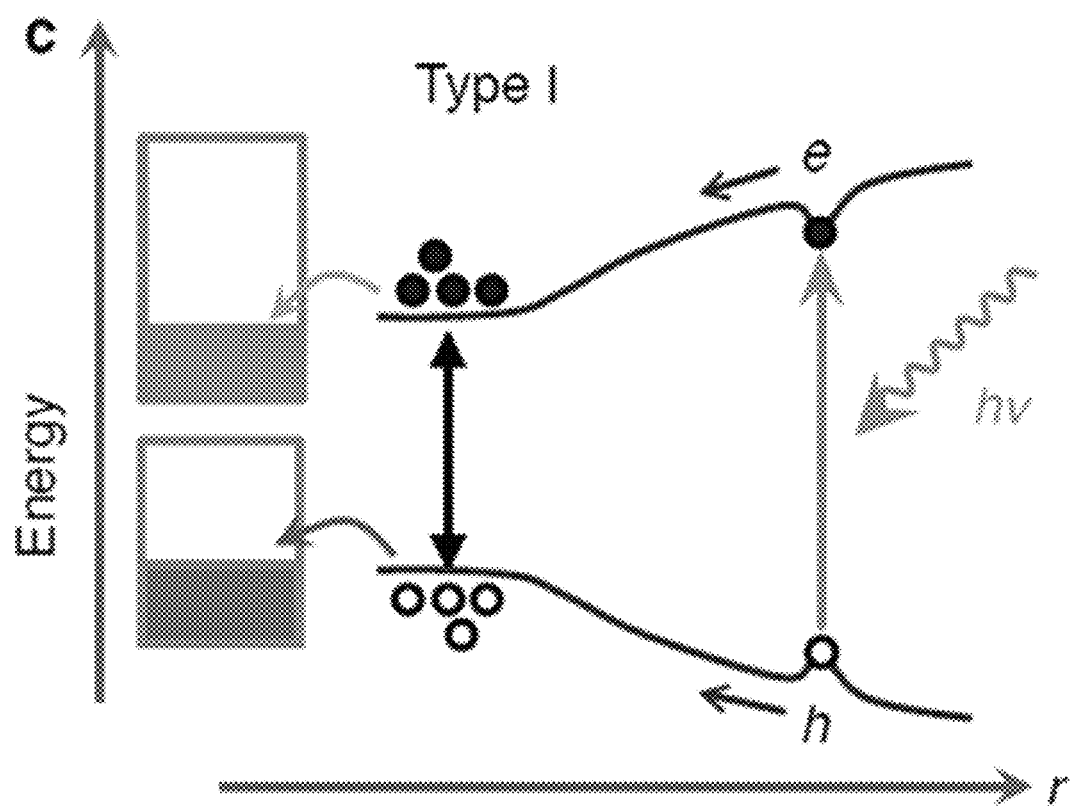
FIG. 11 is a schematic representation of the flow of electrons and holes in a Type I energy funnel.

Based on energy profiles of quasiparticles (i.e., electrons and holes) and photoexcited states (i.e., free electron-hole pairs or strongly bound excitons), a twisted bilayer is expected to exhibit a Type I funneling mechanisms, see FIG. 11. The figure illustrates the energy levels of the charge carriers for a material versus the radial position around an exciton funnel center. The figure also illustrates the migration of electrons e and holes h within the twisted bilayer material after incident electromagnetic radiation hv forms an electron hole pair in the twisted bilayer material. While a twisted bilayer material is expected to exhibit a Type I funneling mechanism, it should be understood that embodiments and methods described herein are equally applicable to other types of funneling mechanisms as well and that the only difference would be the location of the electrical contacts within a single exciton funnel.

In a Type I funnel, the energy level of photoexcited electrons e continuously decreases towards the center while that of holes h increases, see FIG. 11. Consequently, both the electrons e and the holes h migrate towards the center of a given exciton funnel. Therefore, the charge carriers are concentrated at the center where corresponding charge carrier conductors may be positioned. As long as the lifetime of the charge carriers is large enough for the charge carriers to migrate to the center prior to the eventual electron-hole recombination they will be extracted by the charge carrier conductors. It should be understood that while a Type I funnel is expected, regardless of what direction the charge carriers are expected to move, an optoelectronic device may include charge carrier conductors with appropriate electrical contacts arranged to capture the charge carriers according to their drift motion within the one or more exciton funnels of the twisted bilayer material.

The above embodiments have been directed to the concept of a tunable optoelectronic device that either absorbs electromagnetic radiation to create a current or accepts a current to generate electromagnetic radiation. However, twisted bilayer materials may also be used for photocatalysis including, for example, splitting water using photocatalysis water which has an approximate reaction energy of 1.23 eV at 0 pH. Therefore, unlike tuning a band gap using compositional changes as is typically done, a twisted bilayer material offers the ability to easily tune the band gap energy for a particular reaction without the need to undergo lengthy composition development and testing. Additionally, since the optoelectronic material is not being used to create a current or emit light, there is no need to include buffer layers or electrodes as described above which simplifies the manufacture and use of the system. However, it should be understood that many of the properties and device arrangements described above are also applicable to twisted bilayer materials used in photocatalysis.

Without wishing to be bound by theory, a photocatalytic reaction rate increases with increasing surface area of the photocatalyst. Consequently, it may be desirable to increase a surface area of the twisted bilayer material. In one embodiment, a surface area of the optoelectronic material may be increased by creating pores in the twisted bilayer material. The pores may be created using any appropriate method including, but not limited to, electron beam milling, selective etching, photolithography, reactive ion etching, and ion-bombardment, and combinations of the above.

Similar to the optoelectronic devices described above, twisted bilayers used as a photocatalyst may either be manufactured to exhibit a static band gap, or the optoelectronic materials may be engineered to exhibit a dynamic band gap that may be adjusted to a desired energy by adjusting the position and orientation of the semiconducting atomically thin layers comprising the twisted bilayer and/or through the application of pressure and/or electric fields. The ability to adjust the band gap may permit the twisted bilayer material to be used as a photocatalyst for multiple reactions by simply adjusting band gap energy to the desired reaction energy using any of the above-noted methods.

Materials for use as a photocatalyst may be easily screened using a variety of methods. In one embodiment, the energy of a particular reaction may be determined and materials exhibiting somewhat similar band gaps may be identified. The band gap of the identified materials may then be evaluated versus position and orientation of the two layers forming a twisted bilayer material. Those materials that exhibit a range of possible band gap energies versus angular orientation, applied electric field, and/or applied pressure within a desired range may be used as a photocatalyst for the reaction.

Example

General Concept

When two identical monolayer crystals are twisted by an angle θ, a grain boundary is created within the bilayer with a Moiré superlattice pattern (coincidence site lattice) that may be much larger than the primitive lattice vectors $\{l_j\}$ of the underlying monolayer when is small or near some special angles (e.g. Vicnal angles). Such a structure may be termed a twisted bilayer. Unlike grain boundaries in three dimensional solids which are buried and often curved, a twisted bilayer may be atomically flat, and importantly, optically and electronically accessible. Without wishing to be bound by theory, in the small-θ regime, the superlattice period L is approximately proportional to 1/θ and may become comparable or even longer than the prevalent photon wavelength $\lambda_{photon}$ and the electron mean free path $\Lambda_{MFP}$, both of which are often on the order hundreds of nanometers. In the scenario of L is much larger than $\lambda_{photon}$ and $\Lambda_{MFP}$, a semi-classical, phase de-coherent treatment of the electron problem may be used, where a local bandgap energy $E_g(r)$ may be defined as a function of the coarse-grained position $r \equiv r_x e_x + r_y e_y$. Further, how the local band edges (valence band maximum VBM(r); conduction band minimum CBM(r)) are aligned is of interest for charge transport as in chemical heterojunctions. This type of variable bandstructure material without chemical modulation in a twisted bilayer may be called a "pseudoheterostructure". Various measurements and simulation results are provided below.

Example

Modeling Methods

Density-functional-theory (DFT) calculations were performed by using the Vienna ab initio simulation package (VASP). The following was used for the performed simulations: projector augmented-wave (PAW) method; Perdew-Burke-Ernzerhof (PBE) of exchange-correlation functional; an energy cutoff of 400 eV for the plane-wave basis; and Monkhorst-Pack k-point sampling of 10×3×1. Geometry optimizations were performed with a criterion of the maximum residual force less than 0.02 eV/Å. A semi-empirical correction using the Grimme method was also applied to take the van der Waals interaction into account. The curves of $E_g$ varying with r or u were obtained using constant interlayer distance at "metallic"-on-"metallic"-AA (MoM-AA) stacking.

In the presented examples $E_g(r)$ was modeled under the following approximation. When $\theta < \sim 0.05°$, a coarse-grained "stack translation" field pattern u(r) is created that describes the relative translation between the two layers, modulo $\{l_j\}$, see FIGS. 12A and 12B. u(r) satisfies $u(r+L_i)=u(r)$, giving the Moiré superlattice; the amplitude satisfies $-\frac{1}{2} < g_j \cdot u(r) < \frac{1}{2}$ where the reciprocal vectors, $g_j \cdot l_j \equiv \delta_{ij}$, and u=0 is defined to be where the generalized stacking fault energy γ(u) is globally minimized between the two van der Waals (vdW) layers. Usually u=0 is a high-symmetry stacking arrangement like on-top (AA) or Bernal (AB) stacking. The local atomic environment is completely specified by this translational mismatch u which is gently spatially dependent, and the orientational mismatch θ which is spatially independent. So local physical properties like the bandgap may be written as $E_g(r)=E_g(u(r),\theta)$ where the first argument is local translational mismatch and second argument is orientational mismatch of the bilayer. Note that u(r) itself depends on θ, so the dependence of $E_g(u(r),\theta)$ on θ comes from both places in the bracket. When θ is really small, we then make the following analytically justified approximation:

$$E_g(r) \approx E_g(u(r),\theta) \approx E_g(u(r),\theta=0)$$

The last quantity is amenable to density functional theory (DFT) calculations under periodic boundary conditions. In essence computations were performed on local bilayer configurations that were perfectly oriented, but with varying stack translational mismatch $u \equiv u_x e_x + u_y e_y$.

Example

Material Choice

Carbon/boron nitride (CBN) monolayers with $\{l_j\}$ periodic arrangements of carbon and boron nitride (BN) domains have recently been synthesized via photolithography. While the presented concepts and methods are general, CBN lattices were used as a model material for the following reasons. While the electronic structure of twisted bilayer graphene is interesting, it is always metallic with zero bandgap. Instead for the current disclosure it is the variation in bandgap energies, $E_g(r)$, which can be used for exciton funneling from twisted bilayer is made using semiconducting materials that are of interest.

While bilayer $MoS_2$ could be used, first-principles calculations show that $E_g$ does not change much with u. Therefore, for these calculations CBN was chosen because it is mechanically and thermally robust, with an adjustable in-plane C/BN domain structure or hetero-lattice. Additionally, CBN is a true atomic monolayer sheet, which allows intimate coupling between all atoms of the top layer with all atoms of the bottom layer, unlike in $MoS_2$ where the cationic layer is more "hidden" and therefore less affected by stack translation. However, embodiments in which a twisted bilayer is made using atomically thin layers with multiple layers contained therein are also contemplated. Similar justifications to those noted above can also be made for black phosphorus monolayer and phosphorene. Initial calculations show large $E_g$ variation in bilayer phosphorene with stacking, from $E_g=1.04$ eV at AB stacking to $E_g=0.78$ eV at AC stacking, when no pressure is applied.

Without wishing to be bound by theory, large $E_g$ contrast is expected for twisted bilayer CBN (tbCBN), because the C-rich region, in the limit of large in-plane domain size $l \to \infty$, becomes "metallic" graphene with $E_g=0$; whereas the BN-rich region, in the limit of large in-plane domain size $l \to \infty$, becomes "insulating" BN with $E_g=5$ eV. With a bilayer Moiré superlattice, four limiting stacking environments are expected: "metallic"-on-"metallic" (MoM), "metallic"-on-"insulating" (MoI), "insulating"-on-"metallic" (IoM) and "insulating"-on-"insulating" (IoI). The indicators "MoM", "MoI", "IoM" and "IoI" are used to label local bilayer stacking environment, even in cases of $1 < \Lambda_{MFP}$ where quantum overlap causes the C-rich region to have $E_g > 0$ and BN-rich region to have $E_g$ smaller than 5 eV. With l much less than $\Lambda_{MFP}$ and the alternating ribbon geometry described in more detail below, quantum overlap electronically fuses "MoM"/"IoI" regions which are adjacent to each other, and "MoI"/"IoM" regions which are adjacent, cause the coarse-grained MoM/IoI region with VBM, and CBM controlled by MoM, to have a lower band gap than the MoI/IoM regions (hereon abbreviated as IoM). The $E_g$ contrast is expected to be tunable by the in-plane domain size or hetero-lattice spacing $\{l_j\}$, in addition to θ and the interlayer spacing c. Further, if a compressive stress is applied normal to the bilayer, the interlayer spacing c may be reduced and therefore inter-layer electronic coupling may be enhanced. Also, if an electric field is applied normal to the plane, the self-energies of electronic states on the two layers can be changed. Thus, it is expected that normal stress and electric field may alter $E_g$ contrast in tbCBN and twisted bilayer phosphorene (tbP) in addition to other types of twisted bilayer materials as described in more detail below with regards to the other examples.

Example

Multiple "Exciton Basins" in Twisted CBN

A CBN hetero-lattice with $l_1$ fixed at atomic spacing while $l_2$ was varied was studied. As shown in FIGS. 12A and 12B, armchair graphene ribbons and BN ribbons were interlaced, with both C and BN ribbon widths n=9, denoting the number of C—C or B—N dimer along y direction. The size of the primitive cells along x and y direction are defined as $l_1=a=\sqrt{3}b$ and $l_2=9b$, respectively. The internal stacking translation was $u=u_x e_x + u_y e_y = (u_x, u_y)$. When one layer is twisted by a small angle θ, the length of the Moiré superlattice 300 depicted in the figure will be $$L_2 = \frac{\alpha}{2\sin\left(\frac{\theta}{2}\right)} \approx \frac{\alpha}{\theta}$$

in the y-direction and $$L_1 \approx \frac{9b}{\theta}$$

in the x-direction. For a clear illustration of the Moiré pattern θ was set to 2.5° in FIG. 12B so the distance between two nearest AA stacking domains (arrays of empty holes depicted in the figure) will be around 5.7 nm. At position $r=(r_x, r_y)$, $u \approx (-r_y\theta, r_x\theta)$ modulo $\{l_j\}$, and the 2D bandgap field $E_g(u(r))$ were computed and plotted in FIGS. 12D-12E to illustrate the variations in the bandgap energy and formation of exciton funnels.

From the calculations, the bandgap map $E_g(u(r))$ is seen to have multiple "drainage basins", or "exciton funnels", 302. $E_g(u(r))$ acts as an effective potential for exciton translational motion, and the bandgap gradient is experimentally demonstrated to control exciton dynamics. This is because the center-of-mass motion of neutral excitons is not driven by electric field/band bending, but only by $\nabla E_g(u(r))$. The neutral excitons should therefore be funneled to local $E_g$ minima 304, $r_i^{min}$=arg min $E_g$ (u(r)), where i labels the drainage basin, a contiguous region of r where exciton created are expected to flow to $r_i^{min}$ in downhill dynamics. From the calculations, i runs from 1 to 18. In other words, there exists I=18 distinct exciton drainage basins 302 within one twisted bilayer CBN supercell. Even if those basins related by point-group symmetry are excluded, there are still I'=10 unique basins with different minimum $E_g$ 304 as well as shape and size. Between two adjacent basins i and i', there will be one or more saddle points $r_{ii'}^{saddle}$. The watershed, or dividing ridges $r_{ii'}^{watershed}(s)$, labeled 308 in the figures, that separates two nearby basins are marked as white lines in FIG. 12E and as lines between local maxima 306 in FIG. 12F. These ridges can be computed by integrating the streamline equation $$\frac{dr}{ds} = -\nabla E_g(r(s))$$

that goes through the saddle point (s is a scalar parameter). Three dividing ridges $r_{ii'}^{watershed}(s)$, $r_{ii''}^{watershed}(S)$, $r_{i'i''}^{watershed}(s)$ meet at a triple junction point $r_{ii'i''}^{triple}$, which has to be a local maxima in $E_g$. A detailed view of exciton basins around i=1 and streamline pattern is plotted in FIG. 12F. The streamlines are computed using the above equation, with $r_i^{min}$ funnel centers as the flow attractors, $r_{ii'i''}^{triple}$ as flow repellers, and dividing ridges $\{r_{ii'}^{watershed}(s)\}$ that set the boundaries of each basin.

Such intricate patterns of exciton drainage basins as depicted in the figures for tbCBN are surprising for a simple twisted structure. By atomic structure design, for example tuning the shape of the periodic C and BN domains, it may be possible to further engineer the energy-flow pattern. It is also noted here that when θ is tiny but varying, the $E_g(u(r))$ maps thus created are self-similar with peak and valley $E_g$ values invariant, but just spatially scaling as 1/θ. But when θ becomes large, a quantum interference regime may be entered and a new set of quantum-coherent behaviors may emerge.

From the above calculation, $E_g(u(r))$ of tbCBN ranges from about 0.53 to 1.06 eV, and the material achieves a local minima close to AA stacking domains, leading to a triangular array of exciton basins as illustrated in the figures. However, those local minimum values at AA regions are also different, ranging from 0.53 to 0.95 eV, and the lowest value 0.53 eV is located where the bilayer graphene-graphene domains are completely overlapping (MoM). The funnel center of this globally lowest i=1 basin, $E_g(u(r_1^{min}))$=0.53 eV, has MoM-AA stacking locally, where MoM (vs IoM) is called major label, while AA (vs AB, AC, etc.) is called the minor label, of the stacking configuration. The major label here controls the exciton basin index i, while the minor label defines the funnel center of each basin.

Example

Multiple "Exciton Basins" in Phosphorene Bilayer

Figure 13C:
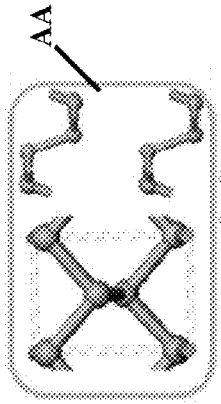
FIG. 13C is a schematic representation of a portion of the Moiré pattern of FIG. 13B exhibiting AA stacking.
Figure 13D:
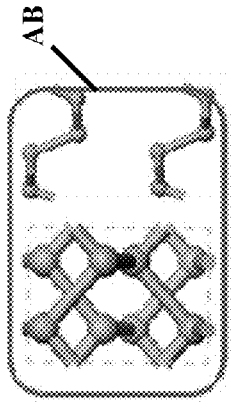
FIG. 13D is a schematic representation of a portion of the Moiré pattern of FIG. 13B exhibiting AB stacking.
Figure 13E:
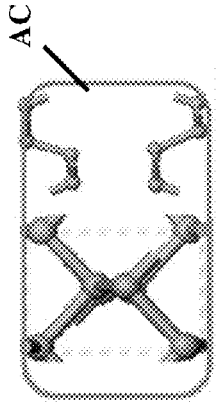
FIG. 13E is a schematic representation of a portion of the Moiré pattern of FIG. 13B exhibiting AC stacking.
Figure 13A:
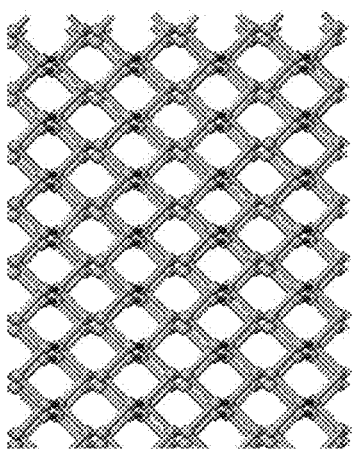
FIG. 13A is a schematic representation of the atomic structure of a phosphorene bilayer.
Figure 13B:
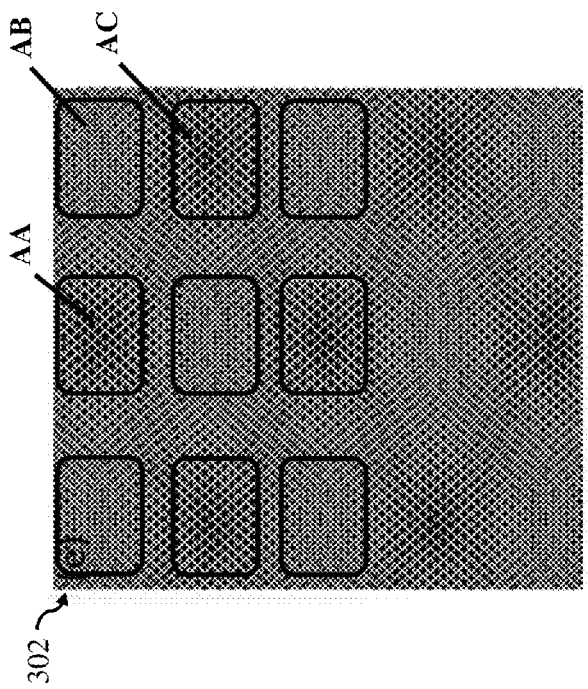
FIG. 13B is a schematic representation of the Moiré pattern formed for the structure of FIG. 13A with a twist angle of 2.5°.
Figure 14A:
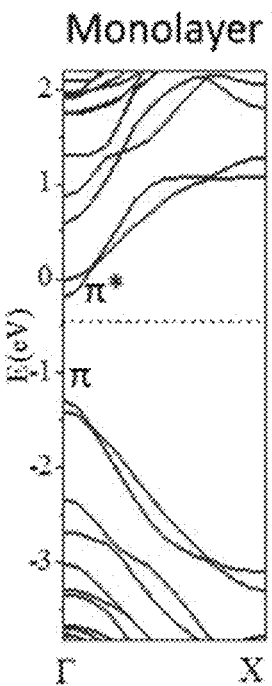
FIG. 14A is a graph of the calculated bandgap structure for a carbon/boron nitride monolayer.
Figure 14B:
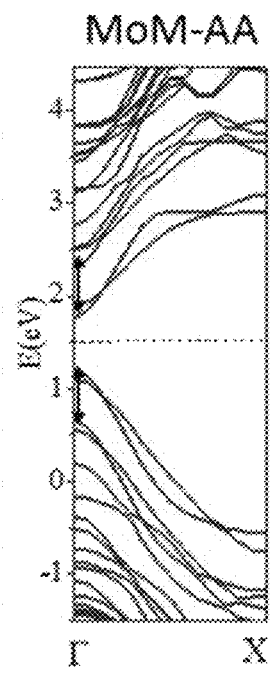
FIG. 14B is a graph of the calculated bandgap structure for a twisted carbon/boron nitride bilayer with metallic on metallic AA stacking.
Figure 14C:
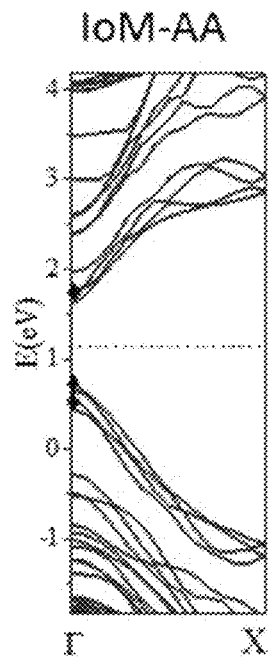
FIG. 14C is a graph of the calculated bandgap structure for a twisted carbon/boron nitride bilayer with insulating on metallic AA stacking.
Figure 14D:
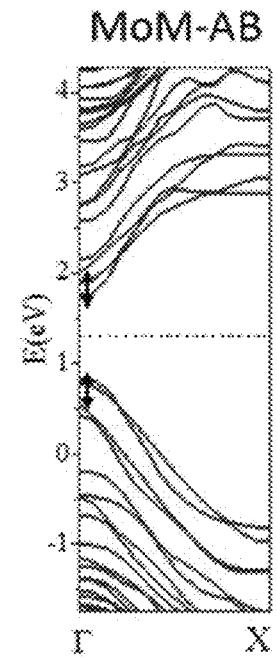
FIG. 14D is a graph of the calculated bandgap structure for a twisted carbon/boron nitride bilayer with insulating on metallic AB stacking.
Figure 14E:
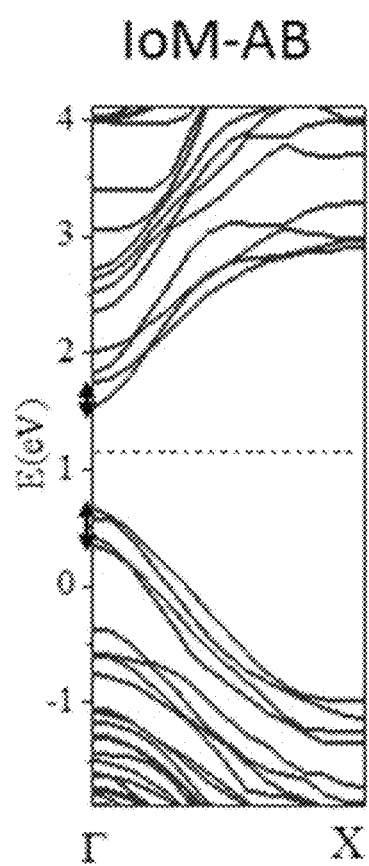
FIG. 14E is a graph of the calculated bandgap structure for a twisted carbon/boron nitride bilayer with metallic on metallic AB stacking.

In comparison to tbCBN, the bandgap landscape of twisted bilayer phosphorene (tbP) is much simpler. As shown in FIGS. 13A and 13B, the Moiré supercell 300 is rectangular, and consists of prototypical AA, AB, and AC stacking regions. According to previous calculations, their local $E_g$ are 0.95, 1.04 and 0.78 eV respectively, and there are only I'=2 types of unique exciton funnels, unrelated by symmetry, with funnel centers labeled by AA and AC stacking with $E_g(u(r_1^{min}))$=0.95 eV and $E_g(u(r_2^{min}))$=0.78 eV, respectively, surrounded by regions with locally maximal $E_g$=1.04 eV at AB stacking. FIGS. 13C-13E show the stacking arrangements for a tbP for AA, AB, and AC stacking arrangements.

Example

Electronic Structure Details of Monolayer and Twisted Bilayer Carbon/Boron Nitride To illustrate the material and structure sensitivities, detailed investigations of tbCBN with multiple exciton basins were performed. FIGS. 14A-14E display the geometric and band structures of some representative stacking environments with u either AA or AB (the minor label), while the graphene domains of one layer may be stacked on either graphene domains (FIGS. 14B and 14D, MoM) or BN domains of the other layer (FIGS. 14C and 14E, IoM), and those four configurations depicted in FIGS. 14B-14E are labeled as MoM-AA (0,0), IoM-AA (a/3, 9b/2), MoM-AB (a/3, 0) and IoM-AB (a/3, 9b/2). Their band gaps are 0.53, 0.88, 0.91 and 0.86 eV respectively compared with 1.09 eV of the n=9 base monolayer shown in FIG. 14A.

There are four bands near the Fermi level in the monolayer CBN bandstructure, denoted as the lowest unoccupied electron states (LUES), second LUES (SLUES), the highest occupied electron state (HOES) and second HOES (SHOES), which are all distributed in graphene domains and identified as π and π* orbitals. As we compare the bandstructures of CBN bilayer in FIGS. 14B-14E with monolayer in FIG. 14A, it is observed that their HOES, SHOES, LUES, SLUES are all split, into 8 bands. This resembles the splitting of two hybridized electronic orbitals in a molecule, but for tbCBN this hybridization takes place between two bands of periodic monolayer systems. The splitting is due to the overlap integral of π orbitals on two layers including the contribution from the electron-electron interactions, which leads to the splitting of HOES and LUES, shifting HOES and LUES closer to each other and reducing $E_g$. For MoM-AA stacking, the π orbitals of graphene domains of bilayer are maximally superposed, which result in high interaction, while the staggering of π clouds of other 3 stacking styles greatly reduces the π-π interlayer interaction and the splitting of HOES and LUES. This can be verified by the splitting strength of HOES δ in FIGS. 14B-14E which are 0.56, 0.17, 0.29 and 0.23 eV respectively.

Figure 18A:
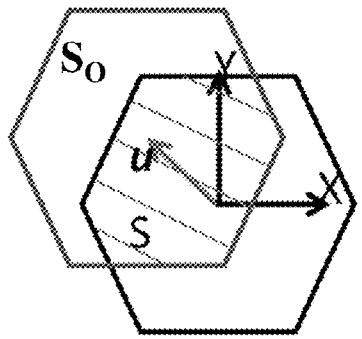
FIG. 18A is a schematic representation of overlapping graphene domains of a carbon/boron nitride twisted bilayer.
Figure 18B:
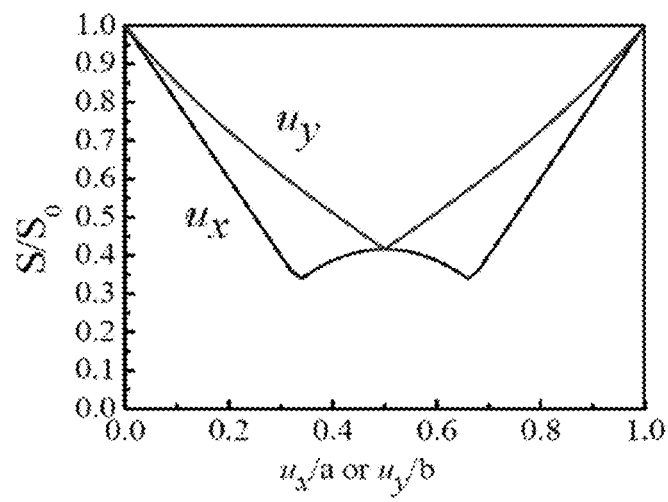
FIG. 18B is a graph of the ratio of the overlapping area of two hexagonal carbon rings versus the area of a carbon hexagonal ring in a graphene domain of a carbon/boron nitride twisted bilayer plotted against lattice displacement.
Figure 18C:
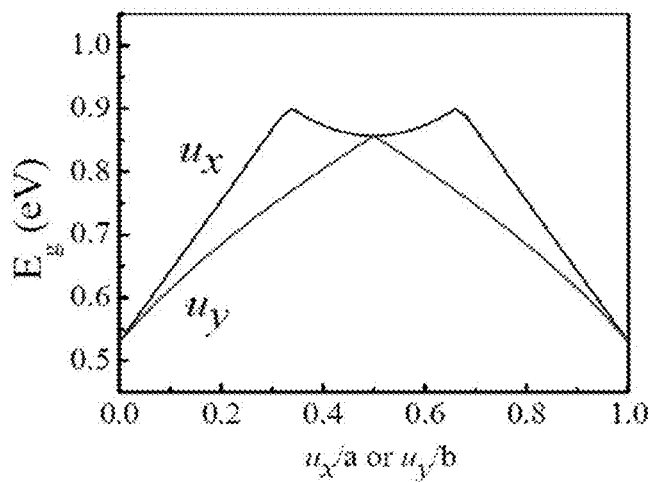
FIG. 18C is a graph of $E_g$ [eV]=1.09−0.56S/$S_0$ in a carbon/boron nitride twisted bilayer plotted against lattice displacement.

Variations in $E_g$ as u changes from (0,0)=AA to (a,0)=AA and from (0, 0)=AA to (0, 9b)=AA is plotted in FIGS. 15A and 15B, respectively, corresponding to the lines $r_x$=0, 0<$r_y$<$L_2$ and $r_y$=0, 0<$r_x$<$L_1$. The area of a carbon hexagonal ring in graphene domain is defined as $S_0$, and the overlapping area of two hexagonal carbon rings in bilayer is defined as S, see FIG. 18A. The change of S from (0,0) to (a, 0) and from (0, 0) to (0, b) is plotted in FIG. 18B. The minimum-S stacking is located at u=(a/3, 0), (2a/3, 0) and (0, b/2) where $E_g$ is the largest, and $E_g$ will decrease when S increases as larger π overlapping leads to stronger interlayer interaction as well as HOES splitting strength δ, see FIG. 18C.

The curve of Eg variation from (0, 0) to (0, 9b) is symmetrical about $u_y$=4.5b and exhibits an oscillating behavior. For those exciton basin centers labelled i=1~5 at AA stacking (black circles), $E_g$(0, 0)=0.53 eV, $E_g$(0, b)=0.81 eV, $E_g$(0, 2b)=0.78 eV, $E_g$(0, 3b)=0.81 eV, $E_g$(0, 4b)=0.95 eV, with HOES splitting δ=0.56, 0.32, 0.34, 0.26, and 0.13 eV respectively. As a general trend, they match the expectation that $E_g$ should increase as the splitting δ decreases with the narrowing bi-graphene domain (MoM region) width m. However, it is unclear why $E_g$(0, 0) is much smaller than $E_g$(0, b), while $E_g$(0,b) is nearly the same, and even 0.03 eV is larger than $E_g$(0, 2b). Here δ is seen to be not linear with respect to the bi-graphene domain width m, and δ-$u_y$ saturation is attributed to an edge effect. Specifically, the edge effected is related to the edge of the bi-graphene domain and the charge carried by carbon atoms $C_B$, $C_N$, $C_1$, $C_2$ (illustrated in FIG. 15C) which are −0.086e, 0.058e, 0.006e, and −0.011e respectively according to Hirshfeld analysis. For the carbon atom $C_B$ bonded to a boron atom in MoM-AA environment, the considerable π electron transferring from B atom will lead to much stronger π-π overlapping with the $C_B$ atom above it. As shown in FIG. 15C, if the upper layer is twisted by 180° so a $C_N$ atom is above the $C_B$ atom, the bandgap will increase from 0.53 eV to 0.66 eV while δ will decrease from 0.56 eV to 0.42 eV. This shows that a considerable portion of π-π overlapping concentrates on the graphene edges. Without wishing to be bound by theory, the post-saturation small oscillations in δ-$u_y$ may be attributable to quantum confinement. The MoM width at (0, b) and (0, 2b) are m=7 and 5; for reference, CBN monolayer with n=7 and 5 has bandgap 0.90 and 0.84 eV, respectively, which may explain why $E_g$(0,b) is larger than $E_g$(0, 2b).

Example

Vicinal Twisted Bilayer

A large Moiré superlattice {$L_i$} with a periodicity $L_i$ much larger than $λ_{photon}$ and $Λ_{MFP}$ may also be generated when θ is very close to a large but special angle like 60° for tbCBN. In the theory of grain boundaries these are called vicinal boundaries, which differ in misorientation from a so-called special grain boundary by a small amount. A vicinal grain boundary can be quite like small-angle grain boundary. Indeed, the Moiré patterns of graphene bilayer at a small twisting angle θ and at an angle of 60° plus or minus θ are substantially identical. However, tbCBN vicinal to 60° is distinct from small-θ tbCBN due to a lack of three-fold symmetry. At a Vicnal twisting angle of 60°, tbCBN will have a rhombic supercell with side length 6a. As shown by the white lines in FIG. 16A, the supercell is evenly divided into four regions: graphene-graphene overlapping (MoM), BN—BN overlapping (IoI) and two graphene-BN overlapping (IoM and MoI). This metamaterial resembles a binary nanoparticle superlattice of semiconductor quantum dots composed of different bandgap domains. Based on this structure, when the twisting angle increases to θ=60°+φ as shown in FIG. 16B, a Moiré pattern will be superimposed on this 2D CBN superlattice, with 6a/φ as the side length of its rhombic unit cell. φ was set to be 2.5° for a total angle θ=62.5° for the superlattice shown in FIG. 16B. Regarding the superlattice of FIG. 16B, there will be only one type of exciton basin located at AA, unlike the multiple exciton basins for small-θ tbCBN. It is interesting to take notice of the three levels of periodicity within the vicinal tbCBN here: the hexagonal atomic rings (primitive structure), the 6a rhombic MoM, IoI, IoM/MoI binary nanoparticle superlattice at θ=60° (secondary structure), and the 6a/φ Moiré superlattice pattern at θ=60° plus or minus φ (tertiary structure). All three levels of structures impact $E_g$(u(r)), although it is the tertiary structure that sets the exciton basin size here.

While a particular Vicnal angle is mentioned above with regards to a single material with a particular symmetry, it should be understood that other angles and other materials might also be used as the disclosure is not so limited.

Example

Exciton Funnel Radius

Previous estimates of the exciton drift length before radiative recombination in carbon/boron nitride range from about 660 nm to 3000 nm. Therefore, in some embodiments, the maximum effective exciton funnel radius may be equal to the exciton drift length. If the Moiré superlattice period L is approximated to be of the same magnitude, for tbCBN, the twist angle θ may be about 0.05° to 0.22° or 60±0.05° to 0.22° to give a funnel radius of about 600 nm to 3000 nm. However, while in some embodiments the exciton funnel widths/radii within a twisted bilayer may be less than a recombination length of an exciton within the material, in other embodiments, the exciton funnel widths/radii may be greater than a recombination length of an exciton within the material as the disclosure is not so limited.

Example

Forming a Twisted Bilayer Material with Folding

FIG. 16C shows the formation of a twisted bilayer Moiré superlattice formed by simply mechanically folding a monolayer of CBN at a desired angle onto itself. In the depicted embodiment, a CBN monolayer was folded at an angle of 60.25° so the angle of between the ribbon directions, i.e. the chosen lattice directions, of the two layers is 59.50° and the periodicity of the resulting Moiré superlattice is around 300 nm. The Moiré tertiary pattern can be visualized by the empty-hole arrays shown in the figure, with dividing ridges of the exciton basins outlined in white.

Example

Modifying the Bandgap Energy of a Twisted Bilayer with Pressure

Figure 17A:
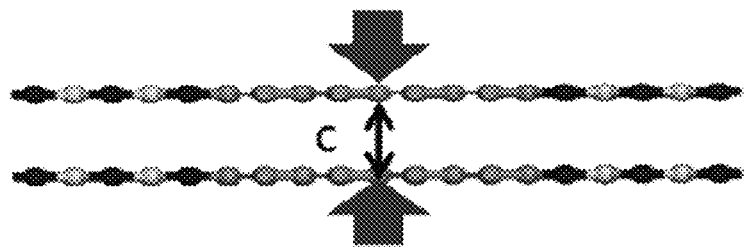
FIG. 17A is a schematic representation of the interlayer distance between two proximate semiconducting atomically thin layers with a pressure applied normal to the layers.
Figure 17B:
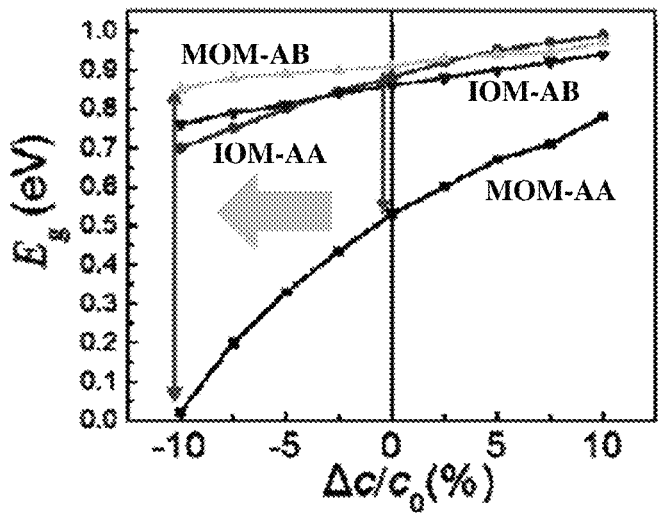
FIG. 17B is a graph of the calculated bandgap energy versus the interlayer distance.

FIG. 17A illustrates a tbCBN with a pressure applied in the vertical direction normal to the semiconducting atomically thin layers forming the twisted bilayer structure. The dependence of $E_g$ on the change of interlayer distance $\Delta c$ for four different stacking styles is shown in FIG. 17B.

Without wishing to be bound by theory, the Young's modulus of graphite is around 1 TPa in-plane but only 15 GPa out-of-plane, so it is relatively easy to change the interlayer distance c using an out-of-plane pressure. With such vertical elastic strain engineering (ESE) of a CBN bilayer, the increasing interlayer interaction can cause larger splitting of LUES-SLUES and HOES-SHOES and further reduce the bandgap. This assumption can be verified by the dependence of $E_g$ on the interlayer distance shown in FIG. 17B. Again different stacking u will play a role: for MoM-AA, $E_g$ will decline much faster with the bilayer compression, and will drop to only 0.02 eV when the interlayer distance is 10% shorter, becoming almost metallic. Thus a local semiconductor-to-metal transition is predicted for tbCBN if a moderate normal pressure is applied. For the other three stacking u's IoM-AA, MoM-AB, IoM-AB, their band gaps only change slightly to 0.70, 0.86 and 0.76 eV, respectively. Therefore we can obtain a much wider bandgap contrast varying from metallic to 0.86 eV by applying pressure to the Moiré superlattice which is more than double in comparison to the range, about 0.53 eV to 0.91 eV, achieved without pressure. The pressure required for interlayer distance to be compressed by 10% is 7.5 GPa for MoM-AA, which is much smaller than for other three stacking styles.

Figure 19:
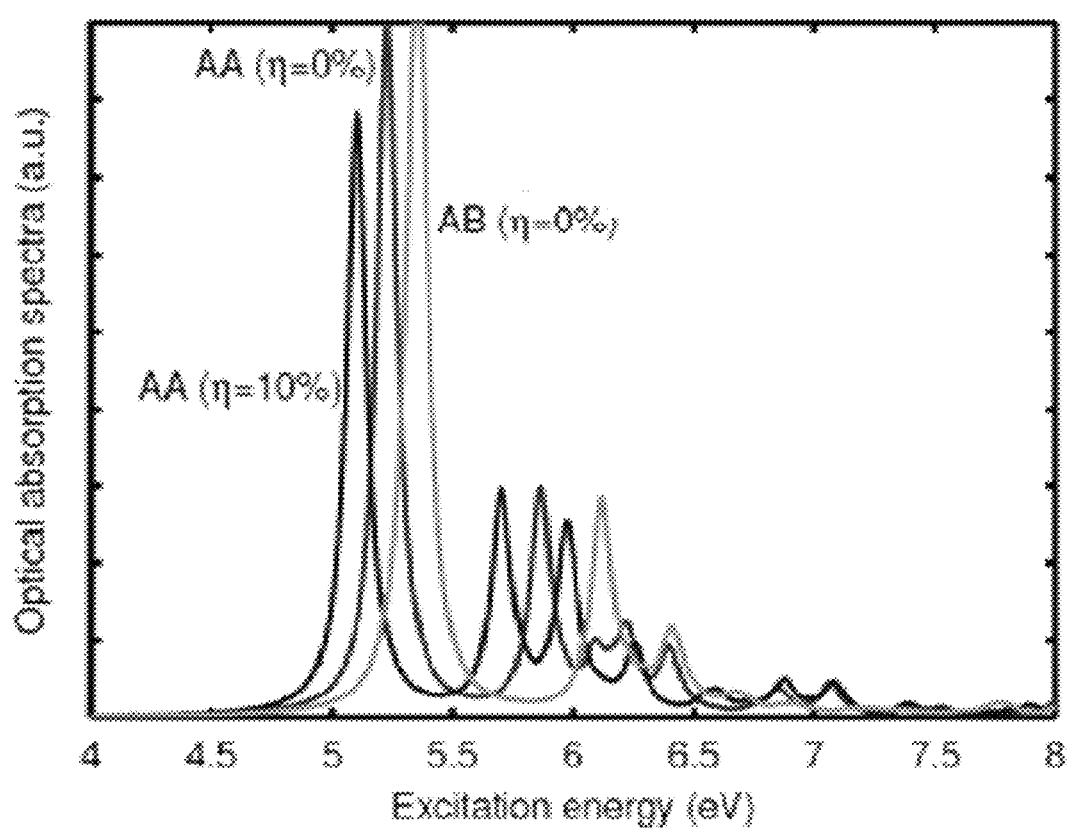
FIG. 19 is a graph of calculated optical absorption spectra for different stacking and compression conditions.

It is known that DFT with PBE can underestimate the band gaps of materials, although here the general dependencies of the bandgap of a tbCBN on stacking style and interlayer distance are unlikely to change. The band gap of a bilayer was measured using the screened exchange hybrid Heyd-Scuseria-Ernzerhof (HSE) functional. However, every unit cell of the bilayers modeled for FIGS. 14B-14E contain 72 atoms, and it would be very time-consuming to compute by using HSE. As a result CBN bilayers with both graphene and BN domains with widths n=4, which is much narrower, were used. The calculated band gap of MoM-AA and IoM-AB stacking are respectively 0.85, 1.15 eV by using PBE, and 1.35, 1.58 eV by using HSE; after the interlayer distance is compressed by 10%, the calculated band gap of MoM-AA and IoM-AB stacking decline to respectively 0.35, 0.95 eV by using PBE, and 0.80, 1.45 eV by using HSE. It seems that the difference between PBE and HSE results is constantly around 0.5 eV, while the dependence of band gap on stacking style and interlayer distance remains. Therefore in FIG. 17A, for HSE results it will be likely that the band gap range is about 1.03 eV to 1.41 eV at zero pressure, and about 0.52 eV to 1.36 eV at $\Delta c=-0.1c_0$ (e.g. 10% compression). To obtain an accurate optical absorption spectrum, the GW-Bethe-Salpeter-Equation (GW-BSE) method was used. It was found that pure h-BN bilayer can also exhibit similar behavior when changing the stacking style or interlayer distance. For the PBE results, the band gap of h-BN bilayer is about 4.57 eV for AB stacking but only 3.99 eV for AA stacking; it even declines to 3.49 eV as the interlayer distance is compressed by 10%. Regarding the optical adsorption spectrum determined using the GW-BSE method: the first peak moved from 5.31 eV of AB stacking to 5.21 eV of AA stacking, and then to 5.10 eV when compressed by 10%, which accords with the trend of band gap change, see FIG. 19.

While particular pressures and materials are noted above, it should be understood that other appropriate pressures both greater than and smaller than those noted above may be applied.

Example

Modifying the Bandgap Energy of a Twisted Bilayer with an Electric Field

Figure 17C:
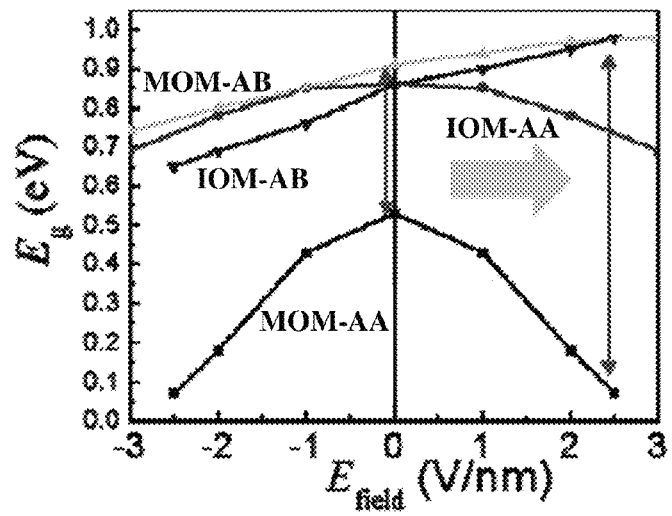
FIG. 17C is a graph of the calculated bandgap energy versus applied electric field.

In addition to the use of pressure, bandgap energy ($E_g$) may be varied and/or a larger bandgap energy can be achieved by applying an external electric field in the vertical direction normal to the semiconductor atomically thin layers forming the twisted bilayer, as shown in the graph of FIG. 17C. For MoM-AA stacking $E_g$ decreases drastically with increasing magnitude of electric field in either direction, which is much more sensitive compared with the other three depicted stacking styles. Moreover, for MoM-AB and IoM-AB stacking, $E_g$ can even be enhanced by electric field. Therefore at an electric field of 2.5 V/nm, the $E_g$ contrast of Moiré superlattice may be between about 0.07 eV to 0.98 eV.

What is claimed is:

1. An optoelectronic device comprising:
   a first semiconducting atomically thin layer having a first lattice direction;
   a second semiconducting atomically thin layer having a second lattice direction, wherein the second semiconducting atomically thin layer is proximate the first semiconducting atomically thin layer, and wherein an angular difference between the first lattice direction and the second lattice direction is between about 0.000001° and 0.5°, or about 0.000001° and 0.5° of a Vicnal angle of the first and second semiconducting atomically thin layers;
   a first charge carrier conductor in electrical communication with the first semiconducting atomically thin layer; and
   a second charge carrier conductor in electrical communication with the second semiconducting atomically thin layer.

2. The optoelectronic device of claim 1, wherein the first semiconducting atomically thin layer and the second semiconducting atomically thin layer are the same material and the first lattice direction and the second lattice direction are the same.

3. The optoelectronic device of claim 1, wherein the first semiconducting atomically thin layer and the second semiconducting atomically thin layer are single crystals.

4. The optoelectronic device of claim 1, wherein the first semiconducting atomically thin layer and the second semiconducting atomically thin layer are monolayers.

5. The optoelectronic device of claim 1, further comprising one or more protective layers disposed between the first charge carrier conductor and the first semiconducting atomically thin layer and/or the second charge carrier conductor and the second semiconducting atomically thin layer.

6. The optoelectronic device of claim 5, wherein the one or more protective layers include one or more openings to provide electrical contact between the first charge carrier conductor and the first semiconducting atomically thin layer and/or between the second charge carrier conductor and the second semiconducting atomically thin layer.

7. The optoelectronic device of claim 5, further comprising a compressive element constructed and arranged to apply between about 1 GPa and 3 GPa normal to the first and second semiconducting atomically thin layers.

8. The optoelectronic device of claim 1, further comprising a capacitor constructed and arranged to apply an electric field with a magnitude between about $0.5 \times 10^9$ V/m and $3 \times 10^9$ V/m normal to the first and second atomically thin layers.

9. The optoelectronic device of claim 1, wherein the first charge carrier conductor and the second charge carrier conductor are aligned.

10. The optoelectronic device of claim 1, further comprising a third charge carrier conductor in electrical communication with the first semiconducting atomically thin layer and a fourth charge carrier conductor in electrical communication with the second semiconducting atomically thin layer.

11. The optoelectronic device of claim 10, wherein a distance between the first and third charge carrier conductors and/or between the second and fourth charge carrier conductors is less than or equal to a relaxation distance of an electron hole pair within the first and second atomically thin layers.

12. The optoelectronic device of claim 1, wherein the first semiconducting atomically thin layer and the second semiconducting atomically thin layer comprise at least one of carbon/boron nitride, gallium(II) sulfide, gallium(II) selenide, gallium(II) telluride, graphitic carbon nitride, hexagonal boron nitride, carbon nitride, phosphorene, and a dichalcogenide.

13. The optoelectronic device of claim 1, wherein the optoelectronic device is a light emitting diode, a solar cell, a photodetector, or an exciton laser.

14. An optoelectronic device comprising:
a first semiconducting atomically thin layer;
a second semiconducting atomically thin layer proximate the first semiconducting atomically thin layer, wherein the first and second semiconducting atomically thin layers form a Moiré superlattice of exciton funnels with a period between about 50 nm to 3 cm;
a first charge carrier conductor in electrical communication with the first semiconducting atomically thin layer; and
a second charge carrier conductor in electrical communication with the second semiconducting atomically thin layer.

15. The optoelectronic device of claim 14, wherein the first semiconducting atomically thin layer and the second semiconducting atomically thin layer are the same material.

16. The optoelectronic device of claim 14, wherein the first semiconducting atomically thin layer and the second semiconducting atomically thin layer are single crystals.

17. The optoelectronic device of claim 14, wherein the first semiconducting atomically thin layer and the second semiconducting atomically thin layer are monolayers.

18. The optoelectronic device of claim 14, further comprising one or more protective layers disposed between the first charge carrier conductor and the first semiconducting atomically thin layer and/or between the second charge carrier conductor and the second semiconducting atomically thin layer.

19. The optoelectronic device of claim 18, wherein the one or more protective layers include one or more openings to provide electrical contact between the first charge carrier conductor and the first semiconducting atomically thin layer and/or the second charge carrier conductor and the second semiconducting atomically thin layer.

20. The optoelectronic device of claim 18, further comprising a compressive element constructed and arranged to apply between about 1 GPa and 3 GPa normal to the first and second semiconducting atomically thin layers.

21. The optoelectronic device of claim 14, further comprising a capacitor constructed and arranged to apply an electric field with a magnitude between about $0.5 \times 10^9$ V/m and $3 \times 10^9$ V/m normal to the first and second atomically thin layers.

22. The optoelectronic device of claim 14, wherein the first charge carrier conductor and the second charge carrier conductor are aligned.

23. The optoelectronic device of claim 14, further comprising a third charge carrier conductor in electrical communication with the first semiconducting atomically thin layer and a fourth charge carrier conductor in electrical communication with the second semiconducting atomically thin layer.

24. The optoelectronic device of claim 23, wherein a distance between the first and third charge carrier conductors and/or between the second and fourth charge carrier conductors is less than or equal to a relaxation distance of an electron hole pair within the first and second semiconducting atomically thin layers.

25. The optoelectronic device of claim 14, wherein the first semiconducting atomically thin layer and the second semiconducting atomically thin layer comprise at least one of carbon/boron nitride, gallium(II) sulfide, gallium(II) selenide, gallium(II) telluride, graphitic carbon nitride, hexagonal boron nitride, carbon nitride, phosphorene, and a dichalcogenide.

26. The optoelectronic device of claim 14, wherein the optoelectronic device is a light emitting diode, a solar cell, a photodetector, or an exciton laser.

* * * * *